United States Patent
Hayami

(10) Patent No.: US 6,670,896 B2
(45) Date of Patent: Dec. 30, 2003

(54) METHOD AND APPARATUS FOR MODULATING AND DEMODULATING DIGITAL DATA

(75) Inventor: Atsushi Hayami, Yokohama (JP)

(73) Assignee: Victor Company of Japan, Ltd., Yokohama (JP)

( * ) Notice: Subject to any disclaimer, the term of this patent is extended or adjusted under 35 U.S.C. 154(b) by 0 days.

(21) Appl. No.: 10/355,115

(22) Filed: Jan. 31, 2003

(65) Prior Publication Data

US 2003/0184455 A1 Oct. 2, 2003

(30) Foreign Application Priority Data

Mar. 28, 2002 (JP) ........................ 2002-091029

(51) Int. Cl.⁷ ............................................. H03M 7/00
(52) U.S. Cl. ............................................ 341/59; 341/68
(58) Field of Search ............................... 341/59, 58, 68, 341/50, 69

(56) References Cited

U.S. PATENT DOCUMENTS

| | | | | |
|---|---|---|---|---|
| 4,750,138 A | * | 6/1988 | Schouhamer Immink | 710/65 |
| 5,198,813 A | * | 3/1993 | Isozaki | 341/59 |
| 5,969,651 A | * | 10/1999 | Okazaki et al. | 341/106 |
| 6,084,536 A | * | 7/2000 | Arts | 341/58 |
| 6,297,753 B1 | | 10/2001 | Hayami | 341/59 |
| 6,573,848 B2 | * | 6/2003 | Hayami | 341/68 |

FOREIGN PATENT DOCUMENTS

JP 2000-286709 10/2000

OTHER PUBLICATIONS

"EFMCC: A New Combi–Code for High Density Optical Recording" by W. Coene, et al., SPEI Article, vol. 4090, pp. 275–282.

* cited by examiner

Primary Examiner—Peguy JeanPierre
(74) Attorney, Agent, or Firm—Louis Woo

(57) ABSTRACT

Main encoding tables are normally used in modulating "p"-bit input data words into "q"-bit output code words. First and second substitution encoding tables are periodically used instead of the main encoding tables in the modulation. Regarding the modulation using the first and second substitution encoding tables, "r" connection bits are added to every resultant "q"-bit output code word to get a "q+r"-bit output code word. An output-code-word sequence is generated by connecting "q"-bit output code words produced by the modulation using the main encoding tables, and "q+r"-bit output code words caused by the modulation using the first and second substitution encoding tables. The main encoding tables are designed to enable DSV control to be executed when a current input data word is equal to one of prescribed input data words. The first and second substitution encoding tables are designed to enable DSV control to be executed.

8 Claims, 25 Drawing Sheets

| FIRST SUB ENCODING TABLE | SECOND SUB ENCODING TABLE | CONNECTION BITS |
|---|---|---|
| Dk | Dk | |
| 0~51 | 0~51 | 01 |
| 52~108 | 52~105 | 10 |
| 109~255 | 106~255 | 00 |

FIG. 24

| CODE WORD CASE CS | LSB-SIDE ZERO RUN LENGTH | ENCODING STATE FOR NEXT CODE WORD |
|---|---|---|
| 0 | 0 | 0, 1 |
| 1 | 1 | 1, 2, 3 |
| 2 | 2~6 | 1, 3, 4, 5 |
| 3 | 7~8 | 3, 4, 5 |
| 4 | 9 | 4, 5 |

FIG. 26

Algorithm in C-language-based Version:

if ((Ck==8208)||(Ck==8224)||(Ck==8225)||(Ck==8256)) flag = 1;

if ((Ck==8712)||(Ck==8720)||(Ck==8738)||(Ck==8777)) flag = 2;

if (Case==0){/* when Ck-1 LSB-side zero run = 0 */ if ((Ck<=1024)||((Ck>=4168)&&(Ck!=4224))) Sk = 0;

if ((1025<=Ck)&&(Ck<=4164)||(Ck==4224)) Sk = 1;} else if (Case==1){/* when Ck-1 LSB-side zero run = 1 */ if ((1025<=Ck)&&(Ck<=4164)||(Ck==4224)) Sk = 1;

if ((Ck<=585)||(Ck>=8712)&&(flag!=2)||(Ck==8704)||(flag==1)) Sk = 2;

if ((Ck==1024)||((4168<=Ck)&&(Ck<=8708)&&(Ck!=4224)&&(Ck!=8704))&&(flag!=1)||(flag==2)) Sk = 3;} else if (Case==2){/* when Ck-1 LSB-side zero run = 2~6 */ if ((1025<=Ck)&&(Ck<=4164)||(Ck==4224)) Sk = 1;

if ((Ck<=1024)||((4168<=Ck)&&(Ck<=8708)&&(Ck!=4224)&&(Ck!=8704))||(flag==2)) Sk = 3;

if ((Ck==8704)||((8712<=Ck)&&(Ck<=16900)&&(Ck!=16896)&&(flag!=2))||(flag==1)) Sk = 4;

if ((Ck==16896)||(Ck>=16904)) Sk = 5;} else if (Case==3){/* when Ck-1 LSB-side zero run = 7 or 8 */ if ((Ck<=1024)||((Ck==9216)||((4168<=Ck)&&(Ck<=8708)&&(Ck!=4224)&&(Ck!=8704))||(flag==2)) Sk = 3;

if ((Ck==16896)||(Ck>=16904)) Sk = 5;

if ((Ck==8704)||((8712<=Ck)&&(Ck<=16900)&&(Ck!=9216)&&(Ck!=16896)&&(flag!=2))||(flag==1)||(Ck==4224)) Sk = 4;} else if (Case==4){/* when Ck-1 LSB-side zero run = 9 or 10 */ if ((Ck==8704)||((8712<=Ck)&&(Ck<=16900)&&(Ck!=16896)&&(flag!=2))||(flag==1)) Sk = 4;

if ((Ck==16896)||(Ck>=16904)) Sk = 5;} return Sk;

----

In the above algorithm: "Case" denotes the case CS; "==" denotes "equal to"; "<=" denotes "smaller than or equal to"; ">=" denotes "greater than or equal to"; and "!=" denotes "not equal to".

METHOD AND APPARATUS FOR MODULATING AND DEMODULATING DIGITAL DATA

BACKGROUND OF THE INVENTION

1. Field of the Invention

This invention relates to a method and an apparatus for modulating or encoding digital data. In addition, this invention relates to a method and an apparatus for demodulating or decoding digital data. Furthermore, this invention relates to a recording medium loaded with modulation-resultant digital data.

2. Description of the Related Art

Some digital data recording or transmission includes a step of "channel coding" which is also called "modulation". The channel coding is as follows. Each block (for example, each byte) of digital data to be recorded or transmitted is modulated into a code word. The resultant code words are serially connected so that the digital data are converted into a code-word sequence in the form of a bit stream. It is desirable that the code-word sequence to be recorded matches the characteristics of a related recording medium or a related transmission channel.

In the case of recording on an optical disc, it is good for recorded digital data to satisfy the following constraints: 1) a minimum zero-run-length constraint (that is, a minimum pit or land length constraint) due to optical transmission characteristics in recording and reading and to physical restrictions involved in pit formation, 2) a maximum zero-run-length constraint (that is, a maximum pit or land length constraint) for the facilitation of a clock-signal recovery, and 3) a constraint on low-frequency signal components for the sake of servo control.

Known modulation systems for digital signals to be recorded include an EFM (eight-to-fifteen modulation) system for compact discs (CDs) and an EFMPlus (eight-to-sixteen modulation) system for digital versatile discs (DVDs). The EFM and EFMPlus systems provide modulation-resultant digital signals which satisfy constraints such that a minimum zero-run-length and a maximum zero-run-length are equal to 3T and 11T respectively, where T denotes a channel bit period.

Specifically, the EFM system encodes every 8-bit block of digital data into a 14-channel-bit code word, and connects the resultant code words while inserting sets of 3 margin bits therebetween. Thus, the EFM system modulates the digital data into a margin-bit-added code-word sequence by conversion from 8 bits to 17 bits. The resultant code-word sequence is in the form of a bit stream. In addition, the resultant code-word sequence is designed to satisfy "RLL(2, 10)" which means run length limiting rules such that 2 to 10 successive channel bits of "0" should be between channel bits of "1". Even at every connection between code words via margin bits, RLL(2, 10) is observed. Since RLL(2, 10) is satisfied, direct-current and low-frequency components of the resultant code-word sequence are suppressed.

The EFMPlus system encodes every 8-bit block of digital data into a 16-bit code word, and serially connects the resultant code words without inserting margin bits therebetween. Thus, the EFMPlus system converts the digital data into a code-word sequence without margin bits by conversion from 8 bits to 16 bits. The resultant code-word sequence is in the form of a bit stream. In addition, the resultant code-word sequence is designed to satisfy RLL(2, 10).

U.S. Pat. No. 6,297,753 B1 corresponding to Japanese patent application publication number P2000-286709A discloses a modulation system for encoding every "p"-bit block of digital data into a "q"-bit code word, serially connecting the resultant code words, and thereby converting the digital data into a code-word sequence in the form of a bit stream which observes run length limiting rules such that a minimum zero-run-length and a maximum zero-run-length are equal to 3T and 11T respectively. The modulation system in U.S. Pat. No. 6,297,753 B1 includes a plurality of encoding tables for converting "p"-bit input data words into "q"-bit output code words. Each of the encoding tables lists output code words and state-information pieces assigned to input data words. The state-information pieces are designed to select one among the encoding tables which will be accessed for the conversion of a next input data word. Furthermore, the group of encoding tables is designed so that the NRZI modulation results of output code words in specified encoding tables which are assigned to each predetermined input data word are opposite in parity or polarity ("odd-even" in the number of bits of "1"). This design of the encoding tables is utilized in performing DSV (digital sum value or digital sum variation) control of the output-code-word sequence.

In an example of the modulation system of U.S. Pat. No. 6,297,753 B1, the numbers "p" and "q" are equal to 8 and 15 respectively. Accordingly, the modulation system implements conversion from 8 bits to 15 bits for modulating digital data into a code-word sequence.

The documents SPIE, Vol. 4090, pages 275–282, which are written by W. Coene and E. Chuang, disclose "EFMCC: A New Combi-Code for High Density Optical Recording". According to the documents SPIE, EFMCC is a run-length-limited (RLL) channel code with EFM-like RLL constraints, RLL(2, 10), which is constructed by combining two codes, a main code and a substitution code. Both codes operate on a byte-by-byte basis. The substitution code has a special structure, i.e., for each byte, there are two possible channel words, which have opposite parity and the same next-state in the finite-state machine of the EFMCC code. The benefits are: guaranteed DC-control, 4% higher efficiency than EFMPlus, and simple byte-oriented look-ahead DC-control encoding.

Specifically, the Comb-Code implies a combination of two channel codes C1 and C2, which both operate on a byte-by-byte basis. Code C1 is called the main code, and maps a byte into a 15-bit channel word: its goal is to realize a high coding rate. Code C2 is called the substitution code, and maps a byte into one out of two possible 17-bit channel words: its goal is to realize a guaranteed DC-control (direct-current-control), at the cost of a lower rate. For each of the coding states of the underlying finite-state machine (FSM), both 17-bit channel words of the substitution code C2 have to satisfy two conditions: (i) both channel words have opposite parity and (ii) both channel words have the same next-state in the FSM. Every byte encoded with the substitution code C2 represents a DC-control point in the channel bit stream since the parity selection at C2 determines the polarity, and thus the contribution to the RDS (running digital sum) value, of the channel bit stream for the subsequent bytes all encoded with the main code C1, up to the next byte encoded with C2. Apart from the polarity, the channel bit stream for the bytes encoded with the main code C1 does not depend on the parity selection at the substitution code C2, i.e., the corresponding (d, k) sequences are identical.

The EFMPlus system uses conversion from 8 bits to 16 bits while the EFM system implements conversion from 8 bits to 17 bits. Therefore, the EFMPlus system is better in coding efficiency than the EFM system by about 6%.

The modulation system in U.S. Pat. No. 6,297,753 B1 uses conversion from 8 bits to 15 bits while the EFMPlus system implements conversion from 8 bits to 16 bits. Therefore, the former system is better in coding efficiency than the latter system by about 6.67%. In the modulation system of U.S. Pat. No. 6,297,753 B1, since the DSV control is of a probability-based type, the DSV has a chance of diverging when digital data assume a specified pattern.

In the EFMCC system or the Comb-Code system, two C2 maps (encoding tables) for generating two possible 17-bit channel words in response to an input byte are required to implement DSV control. Thus, the size of encoding tables is relatively large. Since the encoding of input bytes with a C1 map hardly contributes to the DSV control, the frequency of the execution of the DSV control is limited to a relatively low value.

SUMMARY OF THE INVENTION

It is a first object of this invention to provide a method of modulating digital data which is improved in the size of encoding tables and the frequency of the execution of DSV control.

It is a second object of this invention to provide an apparatus for modulating digital data which is improved in the size of encoding tables and the frequency of the execution of DSV control.

It is a third object of this invention to provide an improved method of demodulating digital data.

It is a fourth object of this invention to provide an improved apparatus for demodulating digital data.

It is a fifth object of this invention to provide an improved recording medium loaded with modulation-resultant digital data.

A first aspect of this invention provides a modulation method comprising the steps of modulating "p"-bit input data words into "q"-bit output code words by referring to a set of main encoding tables, a set of first substitution encoding tables, and a set of second substitution encoding tables, wherein "p" denotes a first predetermined natural number and "q" denotes a second predetermined natural number greater than the number "p"; wherein the main encoding tables contain output code words assigned to input data words, and contain state information accompanying each output code word, wherein the state information designates an encoding table among the main encoding tables and the first and second substitution encoding tables which is used next to generate an output code word immediately following the output code word accompanied with the state information in a manner such that a resultant succession of the output code words follows prescribed run length limiting rules, and wherein NRZI conversion results of output code words in first specified one of the main encoding tables which are assigned to prescribed input data words are opposite in polarity to NRZI conversion results of output code words in second specified one of the main encoding tables which are assigned to the prescribed input data words; wherein the first substitution encoding tables contain output code words assigned to input data words, and contain state information accompanying each output code word, wherein the state information designates an encoding table among the main encoding tables and the first and second substitution encoding tables which is used next to generate an output code word immediately following "r" connection bits connected to the output code word accompanied with the state information in a manner such that a resultant succession of the output code words with the connection bits follows the prescribed run length limiting rules, and wherein "r" denotes a third predetermined natural number; wherein the second substitution encoding tables contain output code words assigned to input data words, and contain state information accompanying each output code word, wherein the state information designates an encoding table among the main encoding tables and the first and second substitution encoding tables which is used next to generate an output code word immediately following "r" connection bits connected to the output code word accompanied with the state information in a manner such that a resultant succession of the output code words with the connection bits follows the prescribed run length limiting rules; wherein NRZI conversion results of output code words in the first substitution encoding tables which are assigned to input data words are opposite in polarity to NRZI conversion results of output code words in the second substitution encoding tables which are assigned to said input data words, and wherein the first substitution encoding tables are equal to the second substitution encoding tables in assignment of state information to input data words; periodically selecting the main encoding tables instead of the first and second substitution encoding tables, and using the selected main encoding tables in modulating "p"-bit input data words into "q"-bit output code words; periodically selecting the first and second substitution encoding tables instead of the main encoding tables, and using the selected first and second substitution encoding tables in modulating "p"-bit input data words into "q"-bit output code words; generating a final "q"-bit output code word in response to a current input data word different from the prescribed input data words by referring to one of the main encoding tables when the main encoding tables are selected; generating a first candidate output code word in response to a current input data word equal to one of the prescribed input data words by referring to the first specified one of the main encoding tables when the main encoding tables are selected; generating a second candidate output code word in response to the current input data word equal to said one of the prescribed input data words by referring to the second specified one of the main encoding tables when the main encoding tables are selected; calculating a first DSV from a succession of output code words including the first candidate output code word; calculating a second DSV from a succession of output code words including the second candidate output code word; determining which of an absolute value of the first DSV and an absolute value of the second DSV is smaller; selecting one from the first and second candidate output code words which corresponds to the smaller DSV absolute value as a final "q"-bit output code word; generating a third candidate output code word in response to a current input data word by referring to one of the first substitution encoding tables when the first and second substitution encoding tables are selected; adding "r" connection bits to the third candidate output code word to get a fourth candidate output code word; generating a fifth candidate output code word in response to the current input data word by referring to one of the second substitution encoding tables when the first and second substitution encoding tables are selected; adding "r" connection bits to the fifth candidate output code word to get a sixth candidate output code word; calculating a third DSV from a succession of output code words including the fourth candidate output code word; calculating a fourth DSV from a succession of output code words including the sixth candidate output code word; determining which of an absolute value of the third DSV and an absolute value of the fourth DSV is smaller; selecting one from the fourth and sixth candidate output code words which corresponds to the smaller DSV absolute value as a final "q+r"-bit output code word; and connecting final "r"-bit output code words and final "q+r"-bit output code words into an output-code-word sequence which follows the prescribed run length limiting rules.

A second aspect of this invention is based on the first aspect thereof, and provides a modulation wherein the numbers "p", "q", and "r" are equal to 8, 15, and 2 respectively, and wherein the prescribed run length limiting rules causes a minimum run length in a result of NRZI conversion of the output-code-word sequence to be equal to 3T, and causes a maximum run length therein to be equal to 14T or less, where T denotes a channel bit period related to the final "r"-bit output code words and the final "q+r"-bit output code words.

A third aspect of this invention provides a modulation apparatus comprising a set of main encoding tables, a set of first substitution encoding tables, and a set of second substitution encoding tables; means for modulating "p"-bit input data words into "q"-bit output code words by referring to the main encoding tables and the first and second substitution encoding tables, wherein "p" denotes a first predetermined natural number and "q" denotes a second predetermined natural number greater than the number "p"; wherein the main encoding tables contain output code words assigned to input data words, and contain state information accompanying each output code word, wherein the state information designates an encoding table among the main encoding tables and the first and second substitution encoding tables which is used next to generate an output code word immediately following the output code word accompanied with the state information in a manner such that a resultant succession of the output code words follows prescribed run length limiting rules, and wherein NRZI conversion results of output code words in first specified one of the main encoding tables which are assigned to prescribed input data words are opposite in polarity to NRZI conversion results of output code words in second specified one of the main encoding tables which are assigned to the prescribed input data words; wherein the first substitution encoding tables contain output code words assigned to input data words, and contain state information accompanying each output code word, wherein the state information designates an encoding table among the main encoding tables and the first and second substitution encoding tables which is used next to generate an output code word immediately following "r" connection bits connected to the output code word accompanied with the state information in a manner such that a resultant succession of the output code words with the connection bits follows the prescribed run length limiting rules, and wherein "r" denotes a third predetermined natural number; wherein the second substitution encoding tables contain output code words assigned to input data words, and contain state information accompanying each output code word, wherein the state information designates an encoding table among the main encoding tables and the first and second substitution encoding tables which is used next to generate an output code word immediately following "r" connection bits connected to the output code word accompanied with the state information in a manner such that a resultant succession of the output code words with the connection bits follows the prescribed run length limiting rules; wherein NRZI conversion results of output code words in the first substitution encoding tables which are assigned to input data words are opposite in polarity to NRZI conversion results of output code words in the second substitution encoding tables which are assigned to said input data words, and wherein the first substitution encoding tables are equal to the second substitution encoding tables in assignment of state information to input data words; means for periodically selecting the main encoding tables instead of the first and second substitution encoding tables, and using the selected main encoding tables in modulating "p"-bit input data words into "q"-bit output code words; means for periodically selecting the first and second substitution encoding tables instead of the main encoding tables, and using the selected first and second substitution encoding tables in modulating "p"-bit input data words into "q"-bit output code words; means for generating a final "q"-bit output code word in response to a current input data word different from the prescribed input data words by referring to one of the main encoding tables when the main encoding tables are selected; means for generating a first candidate output code word in response to a current input data word equal to one of the prescribed input data words by referring to the first specified one of the main encoding tables when the main encoding tables are selected; means for generating a second candidate output code word in response to the current input data word equal to said one of the prescribed input data words by referring to the second specified one of the main encoding tables when the main encoding tables are selected; means for calculating a first DSV from a succession of output code words including the first candidate output code word; means for calculating a second DSV from a succession of output code words including the second candidate output code word; means for determining which of an absolute value of the first DSV and an absolute value of the second DSV is smaller; means for selecting one from the first and second candidate output code words which corresponds to the smaller DSV absolute value as a final "q"-bit output code word; means for generating a third candidate output code word in response to a current input data word by referring to one of the first substitution encoding tables when the first and second substitution encoding tables are selected; means for adding "r" connection bits to the third candidate output code word to get a fourth candidate output code word; means for generating a fifth candidate output code word in response to the current input data word by referring to one of the second substitution encoding tables when the first and second substitution encoding tables are selected; means for adding "r" connection bits to the fifth candidate output code word to get a sixth candidate output code word; means for calculating a third DSV from a succession of output code words including the fourth candidate output code word; means for calculating a fourth DSV from a succession of output code words including the sixth candidate output code word; means for determining which of an absolute value of the third DSV and an absolute value of the fourth DSV is smaller; means for selecting one from the fourth and sixth candidate output code words which corresponds to the smaller DSV absolute value as a final "q+r"-bit output code word; and means for connecting final "r"-bit output code words and final "q+r"-bit output code words into an output-code-word sequence which follows the prescribed run length limiting rules.

A fourth aspect of this invention is based on the third aspect thereof, and provides a modulation apparatus wherein the numbers "p", "q", and "r" are equal to 8, 15, and 2 respectively, and wherein the prescribed run length limiting rules causes a minimum run length in a result of NRZI conversion of the output-code-word sequence to be equal to 3T, and causes a maximum run length therein to be equal to 14T or less, where T denotes a channel bit period related to the final "r"-bit output code words and the final "q+r"-bit output code words.

A fifth aspect of this invention provides a recording medium storing a signal resulting from NRZI conversion of a code-word sequence which is generated by a procedure including the steps of modulating "p"-bit input data words into "q"-bit output code words by referring to a set of main encoding tables, a set of first substitution encoding tables, and a set of second substitution encoding tables, wherein "p" denotes a first predetermined natural number and "q" denotes a second predetermined natural number greater than the number "p"; wherein the main encoding tables contain output code words assigned to input data words, and contain state information accompanying each output code word, wherein the state information designates an encoding table among the main encoding tables and the first and second substitution encoding tables which is used next to generate an output code word immediately following the output code word accompanied with the state information in a manner such that a resultant succession of the output code words follows prescribed run length limiting rules, and wherein NRZI conversion results of output code words in first specified one of the main encoding tables which are assigned to prescribed input data words are opposite in polarity to NRZI conversion results of output code words in second specified one of the main encoding tables which are assigned to the prescribed input data words; wherein the first substitution encoding tables contain output code words assigned to input data words, and contain state information accompanying each output code word, wherein the state information designates an encoding table among the main encoding tables and the first and second substitution encoding tables which is used next to generate an output code word immediately following "r" connection bits connected to the output code word accompanied with the state information in a manner such that a resultant succession of the output code words with the connection bits follows the prescribed run length limiting rules, and wherein "r" denotes a third predetermined natural number; wherein the second substitution encoding tables contain output code words assigned to input data words, and contain state information accompanying each output code word, wherein the state information designates an encoding table among the main encoding tables and the first and second substitution encoding tables which is used next to generate an output code word immediately following "r" connection bits connected to the output code word accompanied with the state information in a manner such that a resultant succession of the output code words with the connection bits follows the prescribed run length limiting rules; wherein NRZI conversion results of output code words in the first substitution encoding tables which are assigned to input data words are opposite in polarity to NRZI conversion results of output code words in the second substitution encoding tables which are assigned to said input data words, and wherein the first substitution encoding tables are equal to the second substitution encoding tables in assignment of state information to input data words; periodically selecting the main encoding tables instead of the first and second substitution encoding tables, and using the selected main encoding tables in modulating "p"-bit input data words into "q"-bit output code words; periodically selecting the first and second substitution encoding tables instead of the main encoding tables, and using the selected first and second substitution encoding tables in modulating "p"-bit input data words into "q"-bit output code words; generating a final "q"-bit output code word in response to a current input data word different from the prescribed input data words by referring to one of the main encoding tables when the main encoding tables are selected; generating a first candidate output code word in response to a current input data word equal to one of the prescribed input data words by referring to the first specified one of the main encoding tables when the main encoding tables are selected; generating a second candidate output code word in response to the current input data word equal to said one of the prescribed input data words by referring to the second specified one of the main encoding tables when the main encoding tables are selected; calculating a first DSV from a succession of output code words including the first candidate output code word; calculating a second DSV from a succession of output code words including the second candidate output code word; determining which of an absolute value of the first DSV and an absolute value of the second DSV is smaller; selecting one from the first and second candidate output code words which corresponds to the smaller DSV absolute value as a final "q"-bit output code word; generating a third candidate output code word in response to a current input data word by referring to one of the first substitution encoding tables when the first and second substitution encoding tables are selected; adding "r" connection bits to the third candidate output code word to get a fourth candidate output code word; generating a fifth candidate output code word in response to the current input data word by referring to one of the second substitution encoding tables when the first and second substitution encoding tables are selected; adding "r" connection bits to the fifth candidate output code word to get a sixth candidate output code word; calculating a third DSV from a succession of output code words including the fourth candidate output code word; calculating a fourth DSV from a succession of output code words including the sixth candidate output code word; determining which of an absolute value of the third DSV and an absolute value of the fourth DSV is smaller; selecting one from the fourth and sixth candidate output code words which corresponds to the smaller DSV absolute value as a final "q+r"-bit output code word; and connecting final "r"-bit output code words and final "q+r"-bit output code words into an output-code-word sequence which follows the prescribed run length limiting rules; wherein the numbers "p", "q", and "r" are equal to 8, 15, and 2 respectively, and wherein the prescribed run length limiting rules causes a minimum run length in a result of NRZI conversion of the output-code-word sequence to be equal to 3T, and causes a maximum run length therein to be equal to 14T or less, where T denotes a channel bit period related to the final "r"-bit output code words and the final "q+r"-bit output code words.

A sixth aspect of this invention provides a method of demodulating a code-word sequence, which is generated by the modulation method of the first aspect of this invention, into a data-word sequence. The demodulating method comprises the steps of detecting whether a current input code word results from modulation using one of the main encoding tables or modulation using one of the first and second substitution encoding tables; when it is detected that the current input code word results from modulation using one of the main encoding tables, generating first encoding-state information from the current input code word and a next input code word, the first encoding-state information representing which of the main encoding tables has been used in generating the next input code word; demodulating the current input code word into an original data word by referring to a main decoding table in response to the current input code word and the first encoding-state information; when it is detected that the current input code word results from modulation using one of the first and second substitution encoding tables, selecting one from first and second substitution decoding tables in response to the current input code word; when it is detected that the current input code word results from modulation using one of the first and second substitution encoding tables, deleting connection bits from the current input code word to get a normal-length current input code word; generating second encoding-state information from the normal-length current input code word and a next input code word, the second encoding-state information representing which of the first and second substitution encoding tables has been used in generating the next input code word; and demodulating the normal-length current input code word into an original data word by referring to the selected substitution decoding table in response to the normal-length current input code word and the second encoding-state information.

A seventh aspect of this invention provides an apparatus for demodulating a code-word sequence, which is generated by the apparatus of the third aspect of this invention, into a data-word sequence. The demodulating apparatus comprises means for detecting whether a current input code word results from modulation using one of the main encoding tables or modulation using one of the first and second substitution encoding tables; means for, when it is detected that the current input code word results from modulation using one of the main encoding tables, generating first encoding-state information from the current input code word and a next input code word, the first encoding-state information representing which of the main encoding tables has been used in generating the next input code word; means for demodulating the current input code word into an original data word by referring to a main decoding table in response to the current input code word and the first encoding-state information; means for, when it is detected that the current input code word results from modulation using one of the first and second substitution encoding tables, selecting one from first and second substitution decoding tables in response to the current input code word; means for, when it is detected that the current input code word results from modulation using one of the first and second substitution encoding tables, deleting connection bits from the current input code word to get a normal-length current input code word; means for generating second encoding-state information from the normal-length current input code word and a next input code word, the second encoding-state information representing which of the first and second substitution encoding tables has been used in generating the next input code word; and means for demodulating the normal-length current input code word into an original data word by referring to the selected substitution decoding table in response to the normal-length current input code word and the second encoding-state information.

An eighth aspect of this invention provides a modulation apparatus comprising main encoding tables for conversion from "p"-bit input data words into "q"-bit output code words accompanied with next-table selection numbers respectively, the main encoding tables having different ID numbers respectively, wherein "p" denotes a first predetermined natural number and "q" denotes a second predetermined natural number greater than the number "p"; first substitution encoding tables for conversion from "p"-bit input data words into "q"-bit output code words accompanied with next-table selection numbers respectively, the first substitution encoding tables having different ID numbers respectively; second substitution encoding tables for conversion from "p"-bit input data words into "q"-bit output code words accompanied with next-table selection numbers respectively, the second substitution encoding tables having different ID numbers respectively; means for generating a first candidate output code word in response to a first input data word by referring to one of the first substitution encoding tables which has an ID number equal to a next-table selection number accompanying an output code word for an input data word immediately preceding the first input data word; means for adding "r" connection bits to the first candidate output code word to get a second candidate output code word without referring to the first substitution encoding tables, wherein "r" denotes a third predetermined natural number; means for generating a third candidate output code word in response to the first input data word by referring to one of the second substitution encoding tables which has an ID number equal to the next-table selection number accompanying the output code word for the input data word immediately preceding the first input data word; means for adding "r" connection bits to the third candidate output code word to get a fourth candidate output code word without referring to the second substitution encoding tables; means for generating a final "q"-bit output code word in response to a second input data word by referring to one of the main encoding tables which has an ID number equal to a next-table selection number accompanying one of the first and third candidate output code words; means for generating a first succession of output code words including the second candidate output code word and the final "q"-bit output code word; means for generating a second succession of output code words including the fourth candidate output code word and the final "q"-bit output code word; means for calculating a first DSV from the first succession of output code words; means for calculating a second DSV from the second succession of output code words; means for comparing the first DSV and the second DSV with each other to get a DSV comparison result; means for selecting one from the second and fourth candidate output code words in response to the DSV comparison result as a final "q+r"-bit output code word; and means for connecting the final "r"-bit output code word and the final "q+r"-bit output code word into a portion of an output-code-word sequence which follows prescribed run length limiting rules.

BRIEF DESCRIPTION OF THE DRAWINGS

Figure 5:
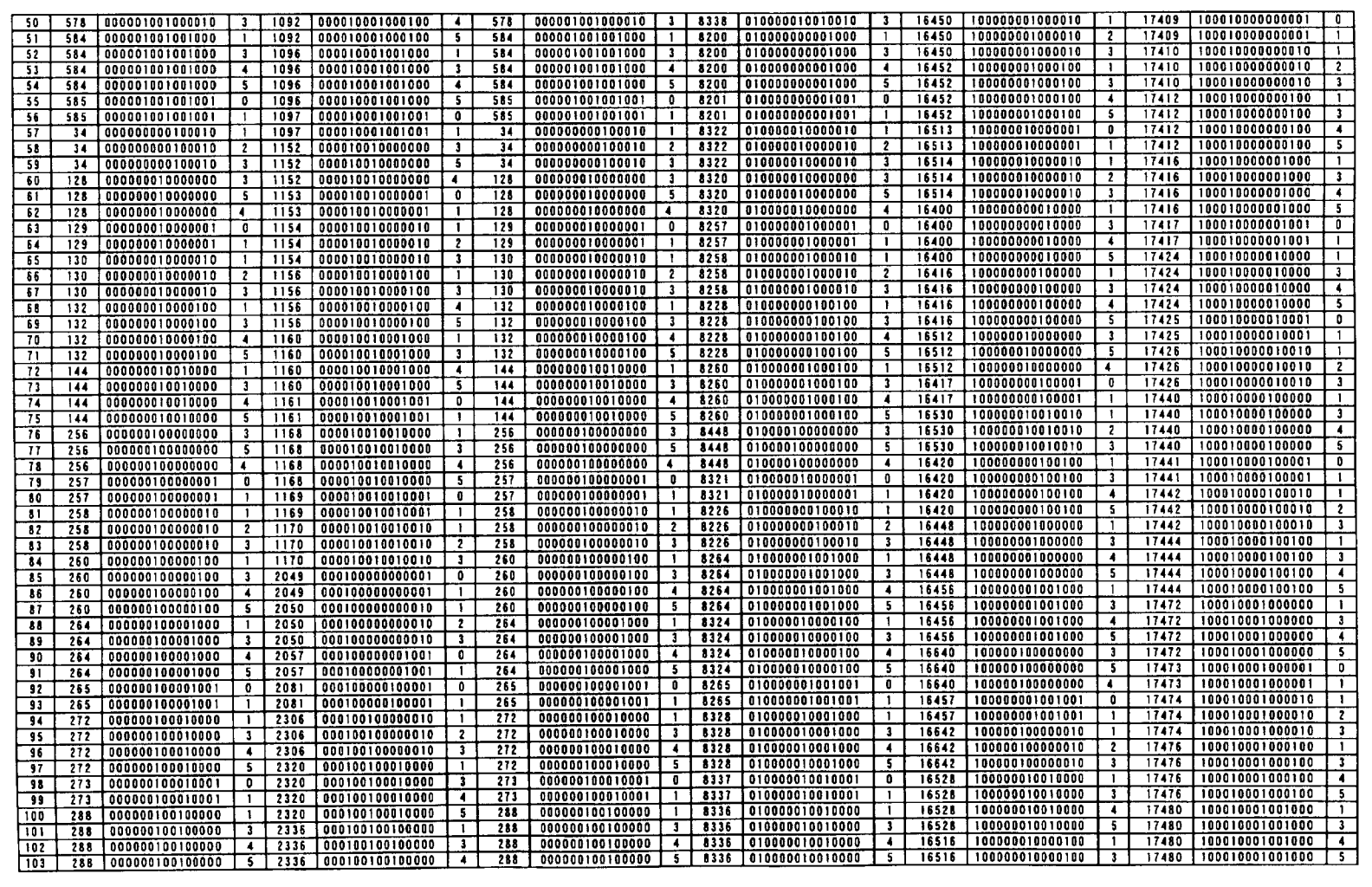
Figure 6:
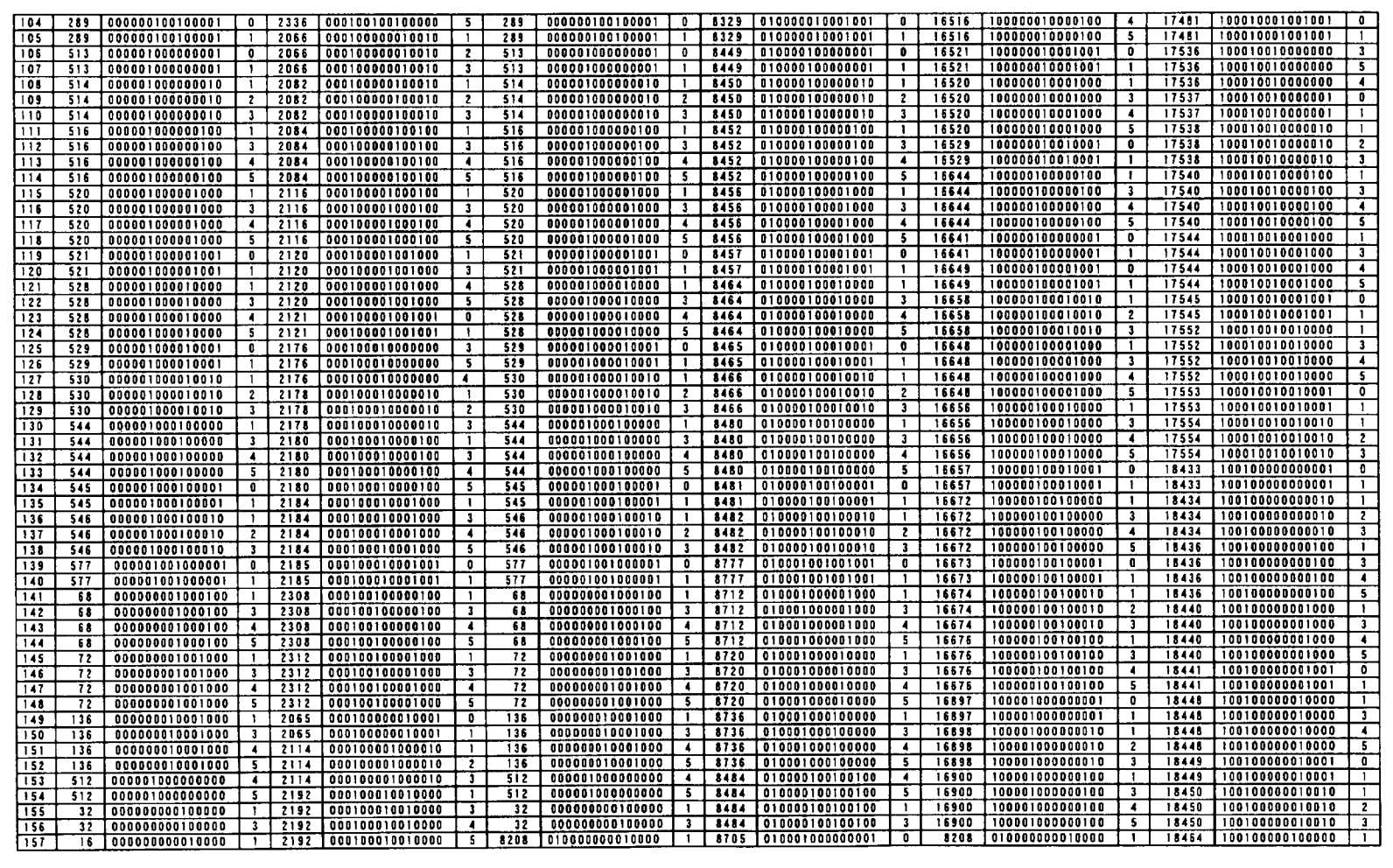
Figure 7:
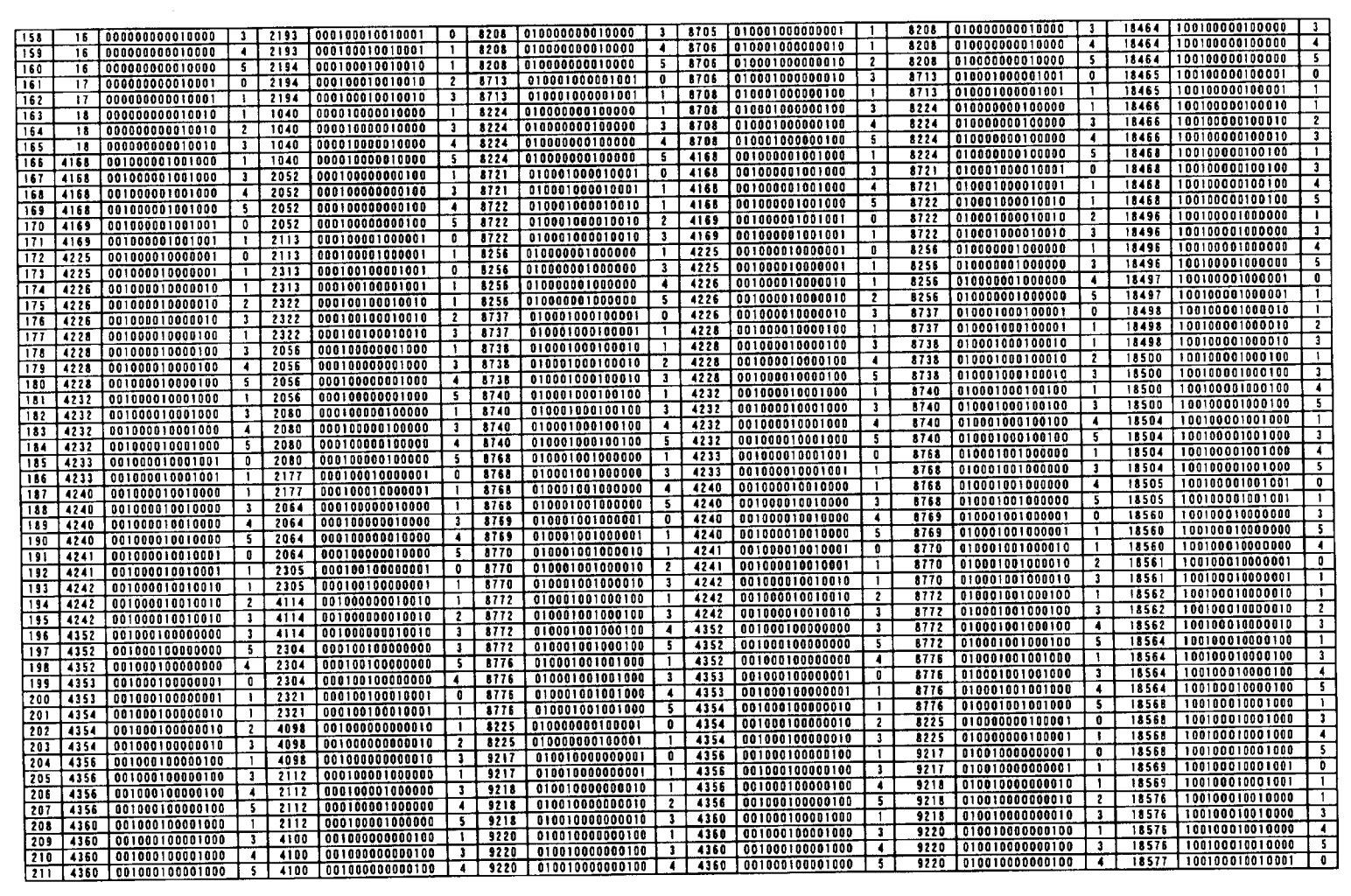
Figure 8:
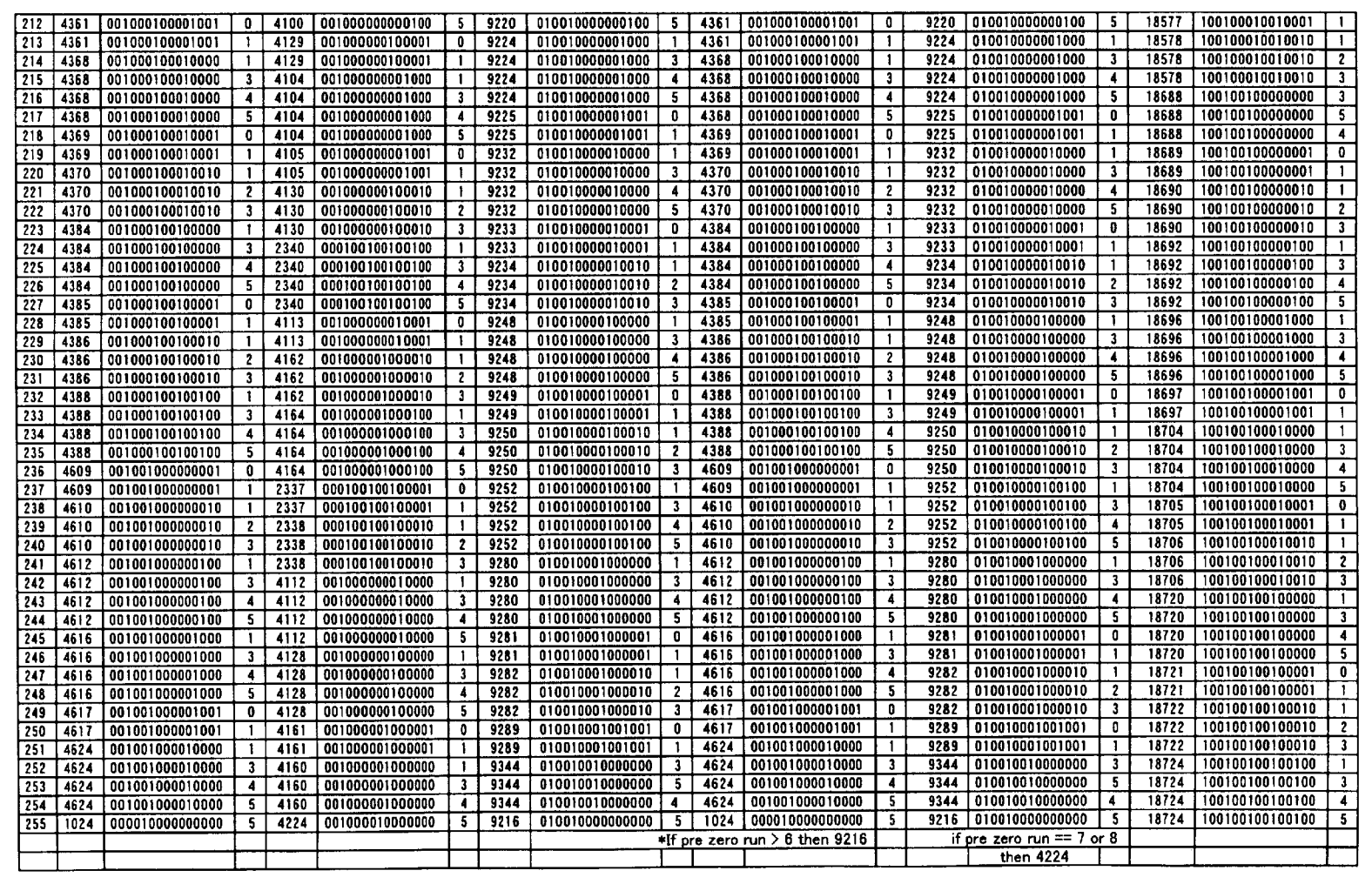

FIGS. 4, 5, 6, 7, and 8 are diagrams showing an example of the contents of main encoding tables in FIGS. 1 and 2.

Figure 9:
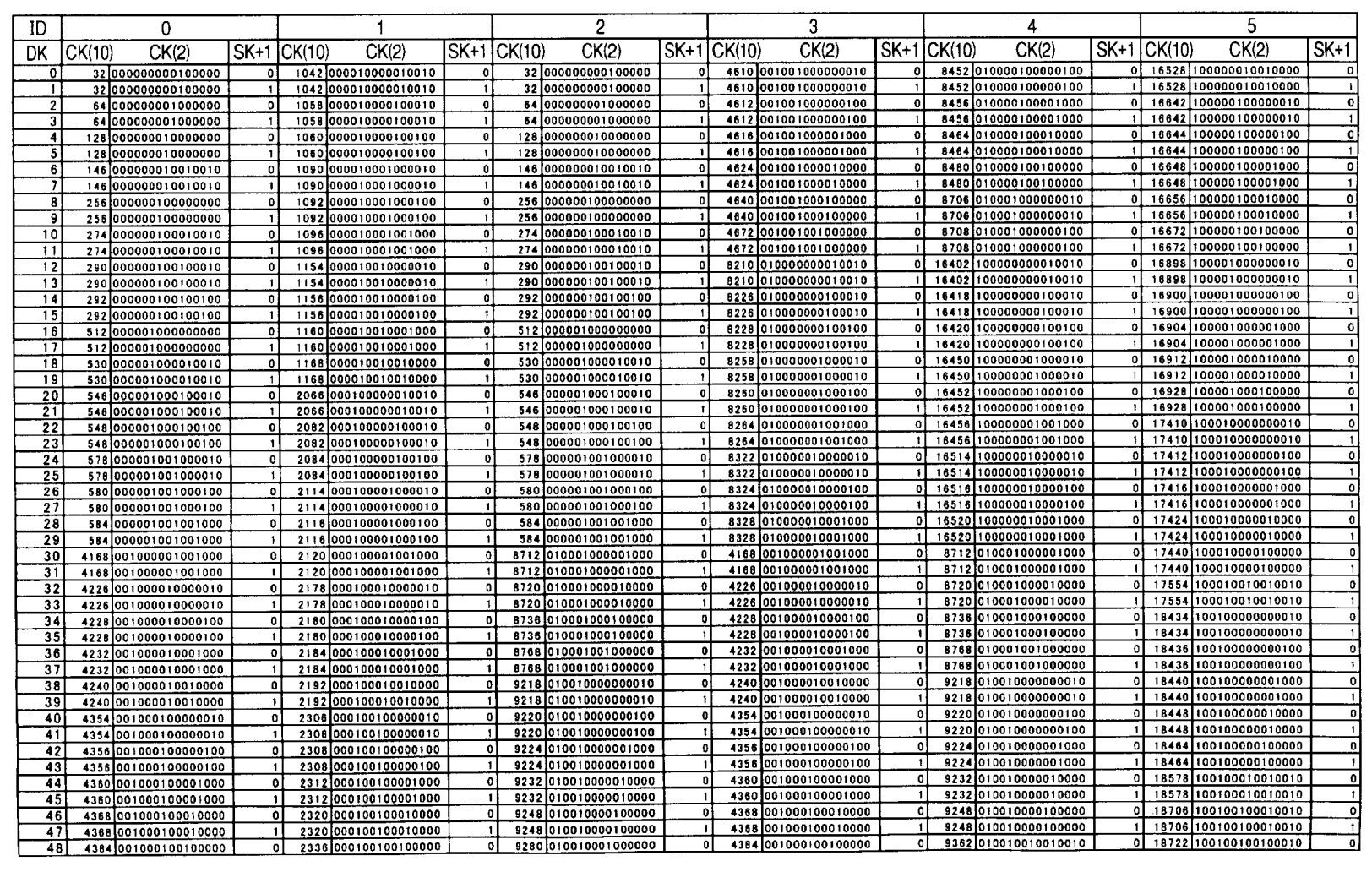
Figure 10:
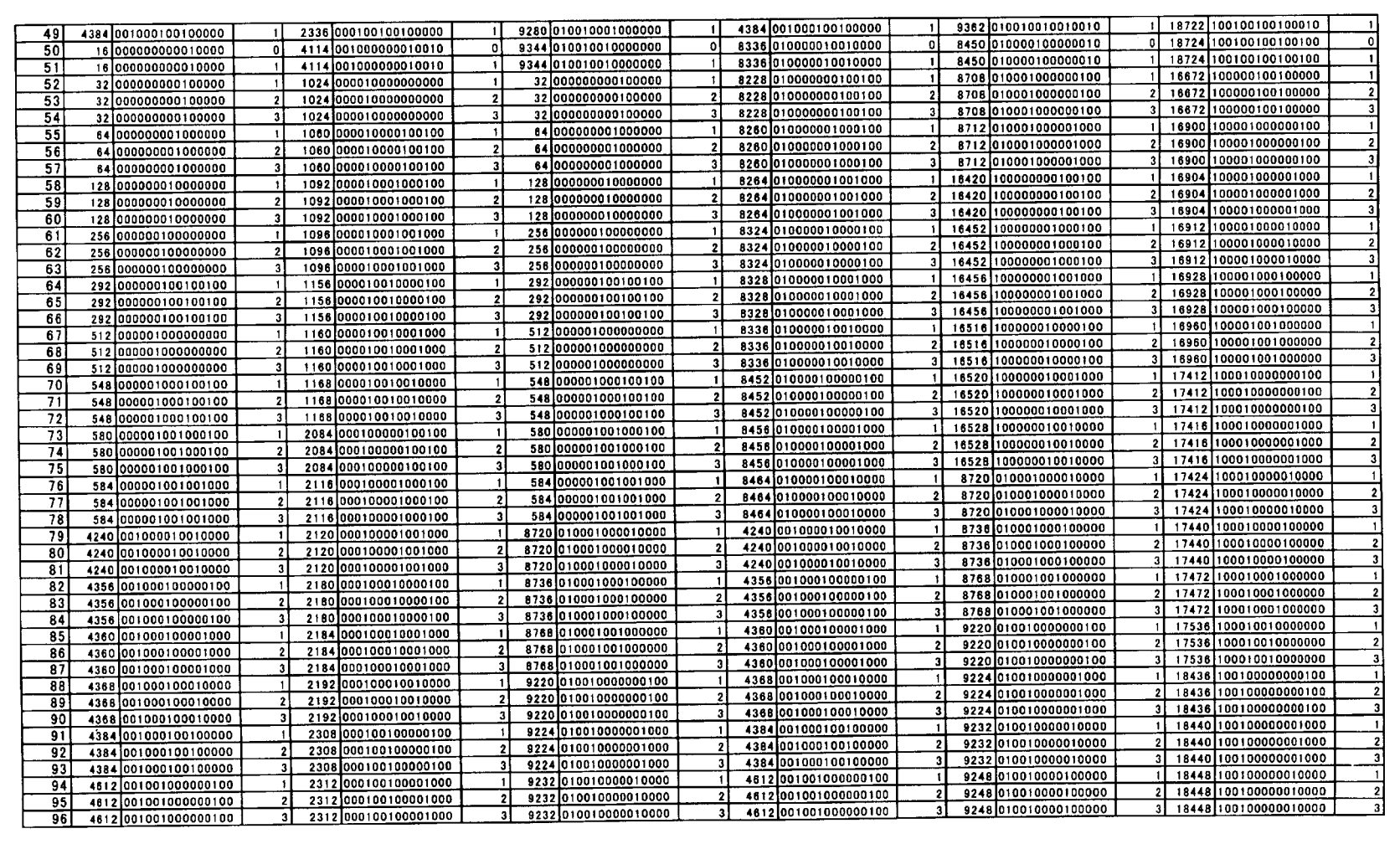
Figure 11:
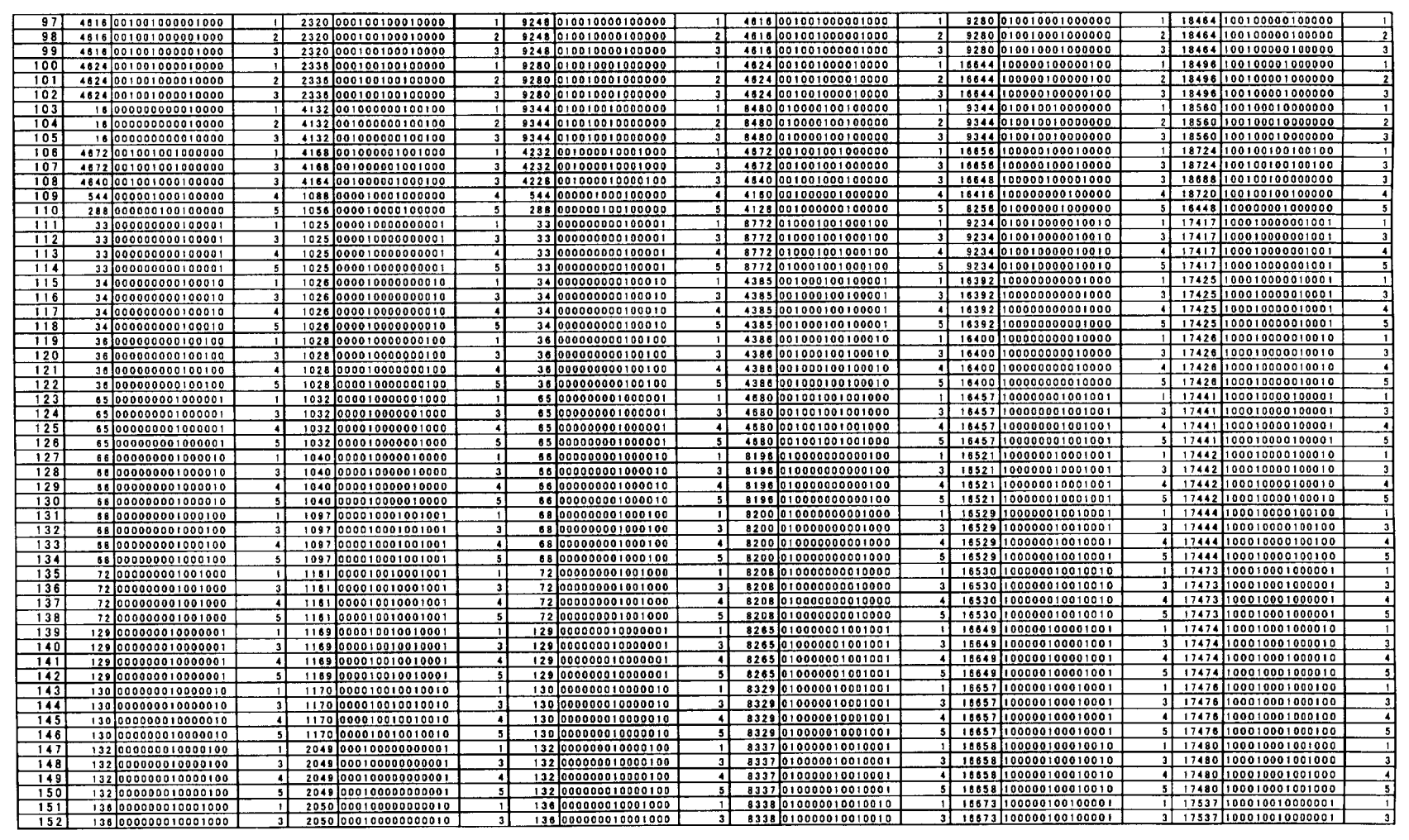
Figure 12:
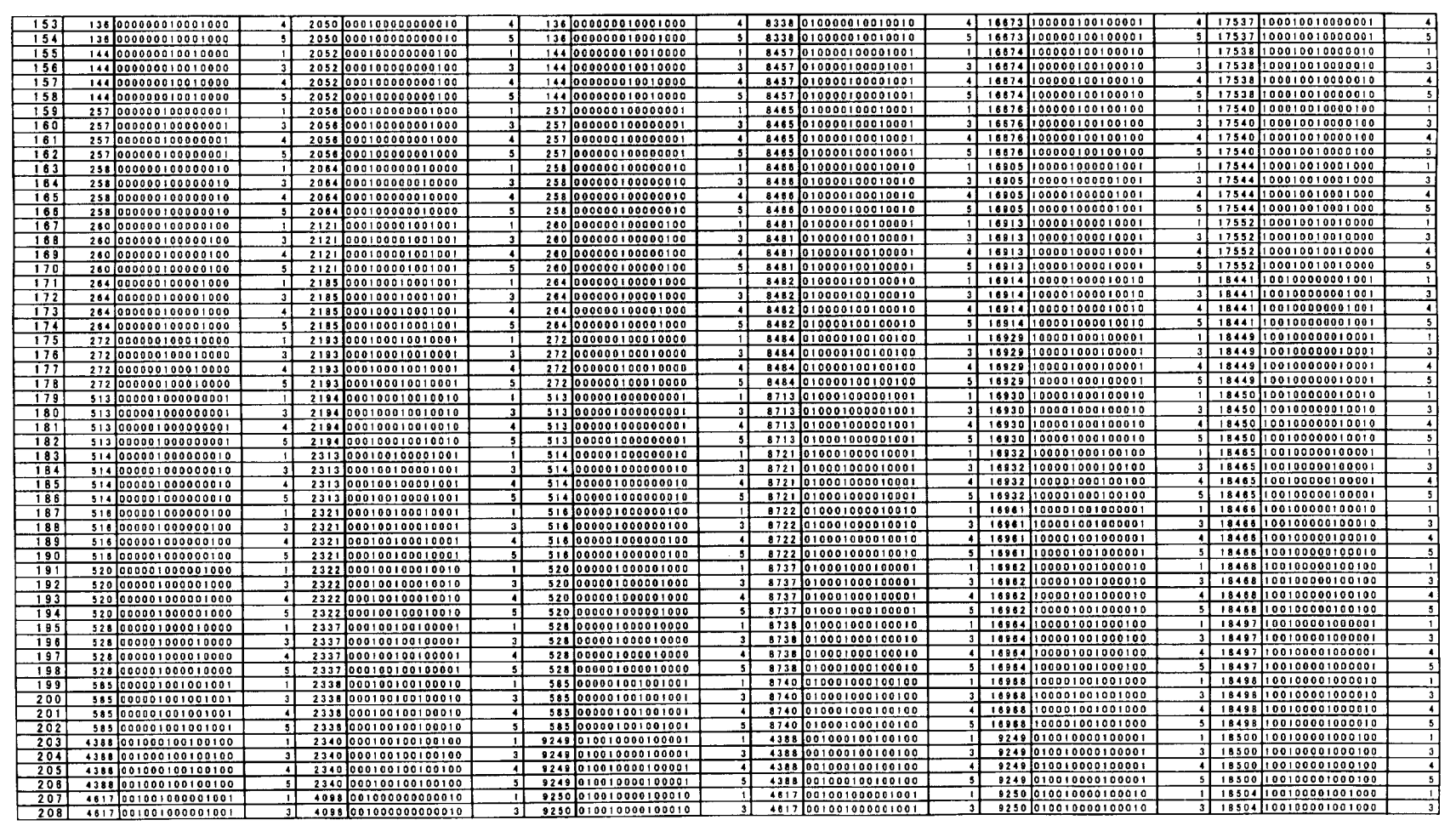
Figure 13:
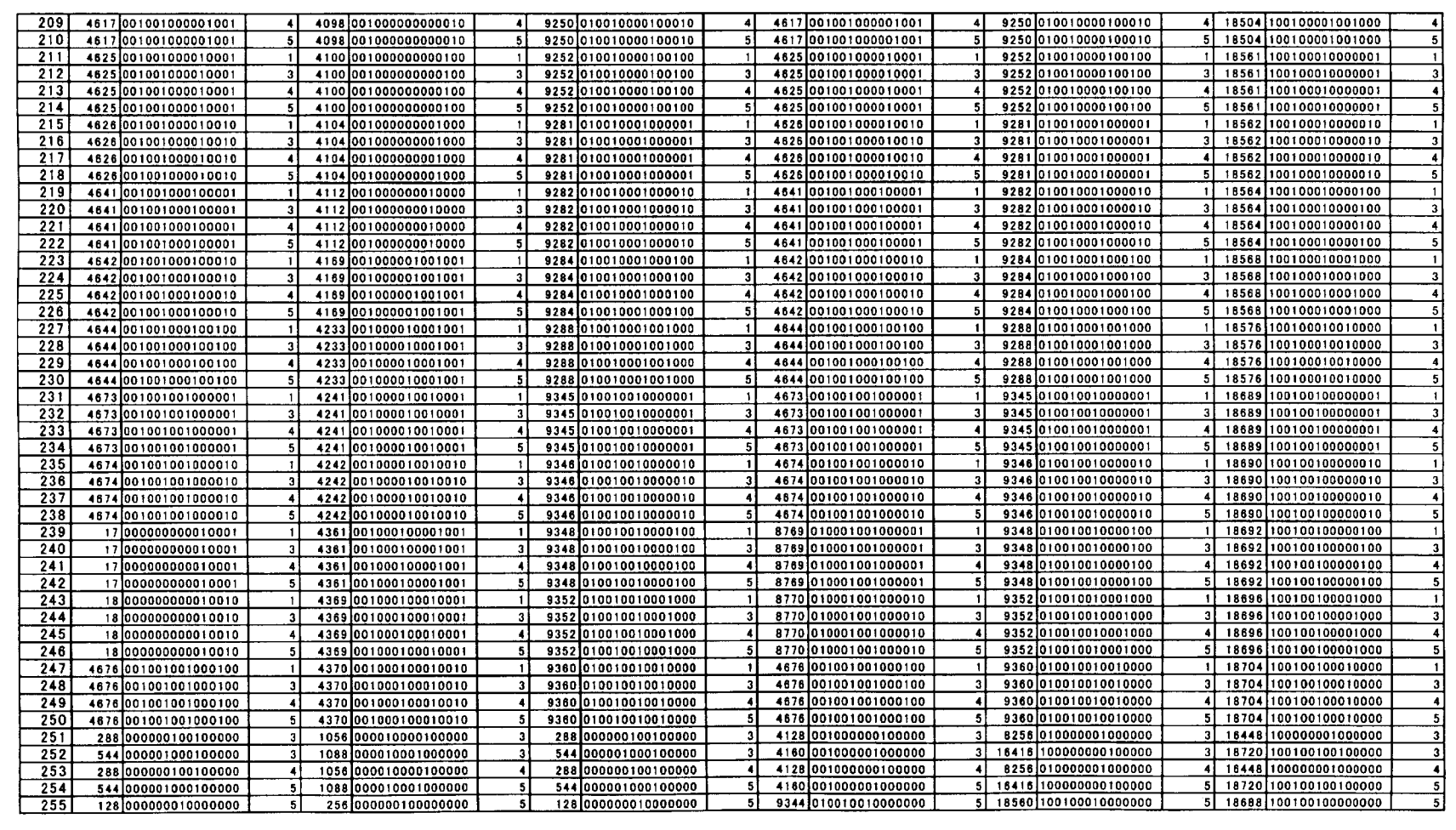

FIGS. 9, 10, 11, 12, and 13 are diagrams showing an example of the contents of first substitution encoding tables in FIGS. 1 and 2.

Figure 14:
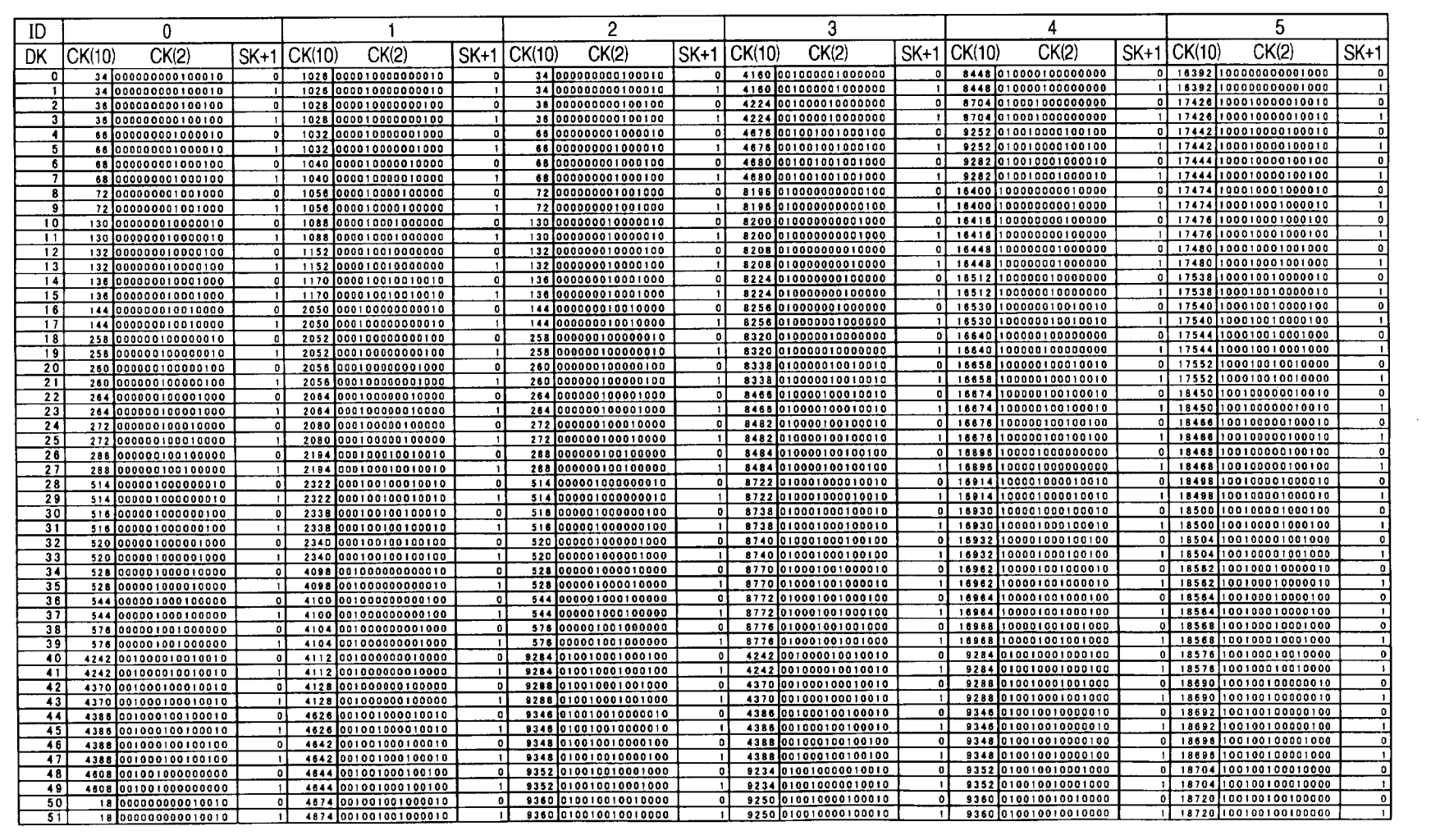
Figure 15:
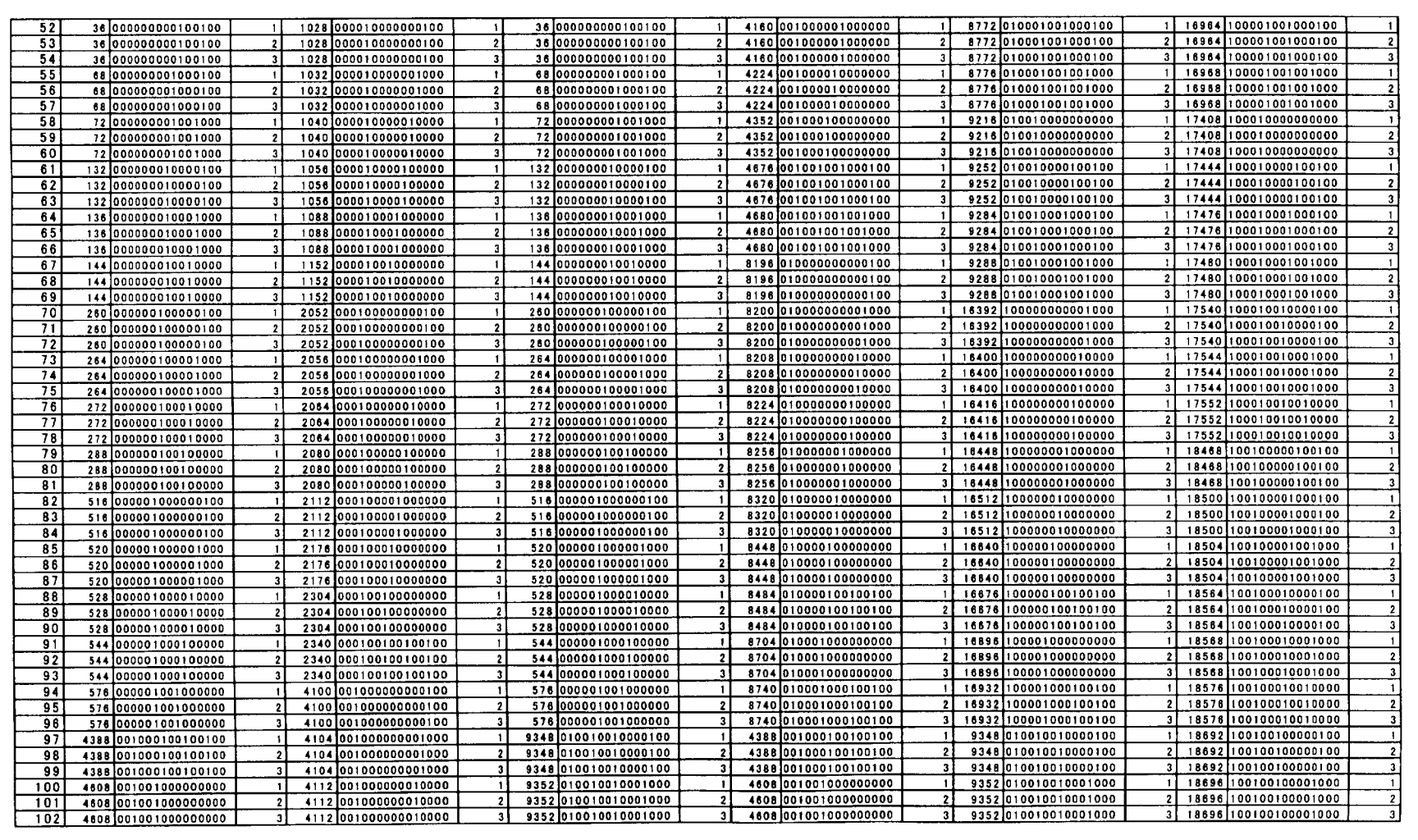
Figure 16:
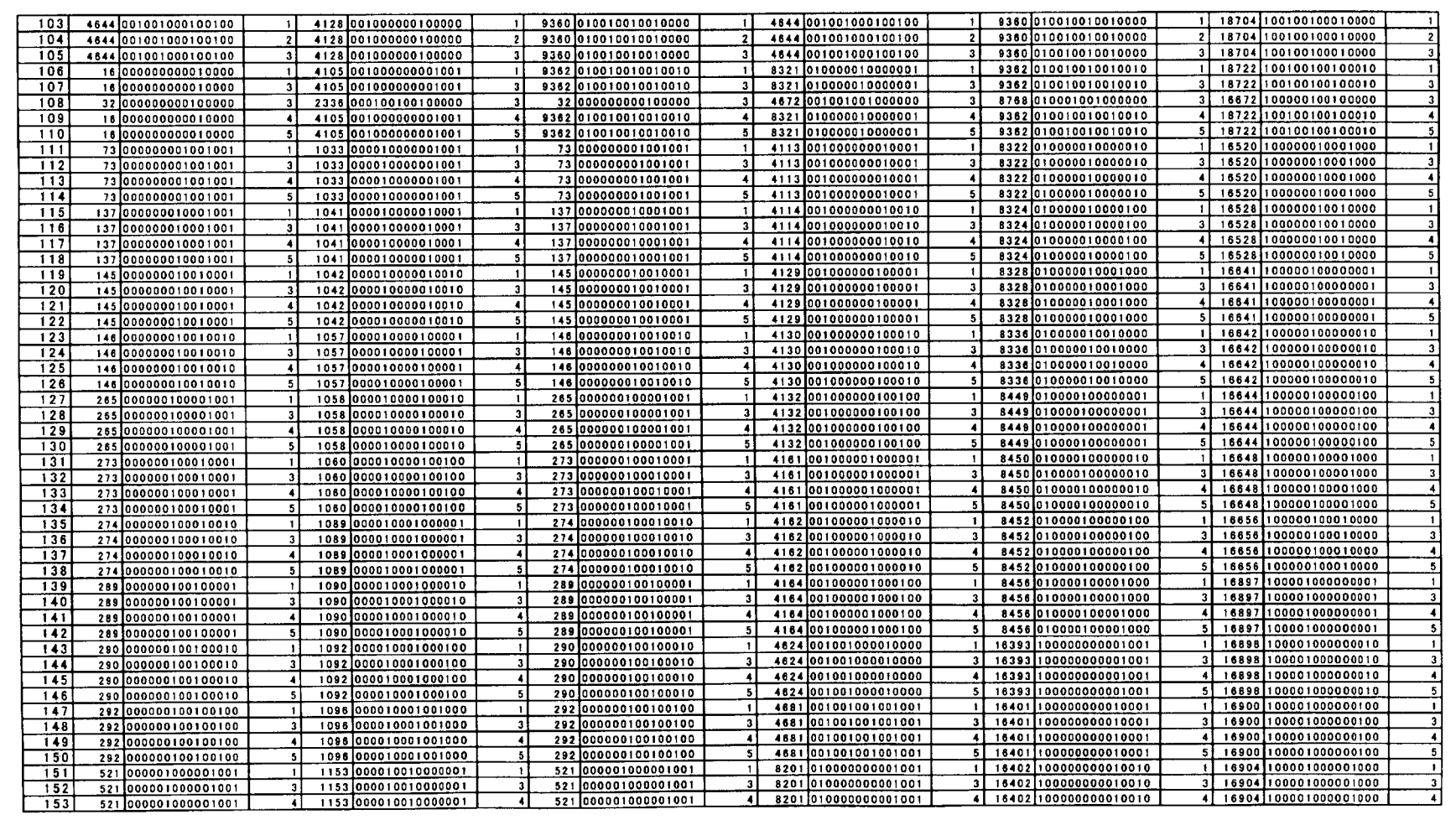
Figure 17:
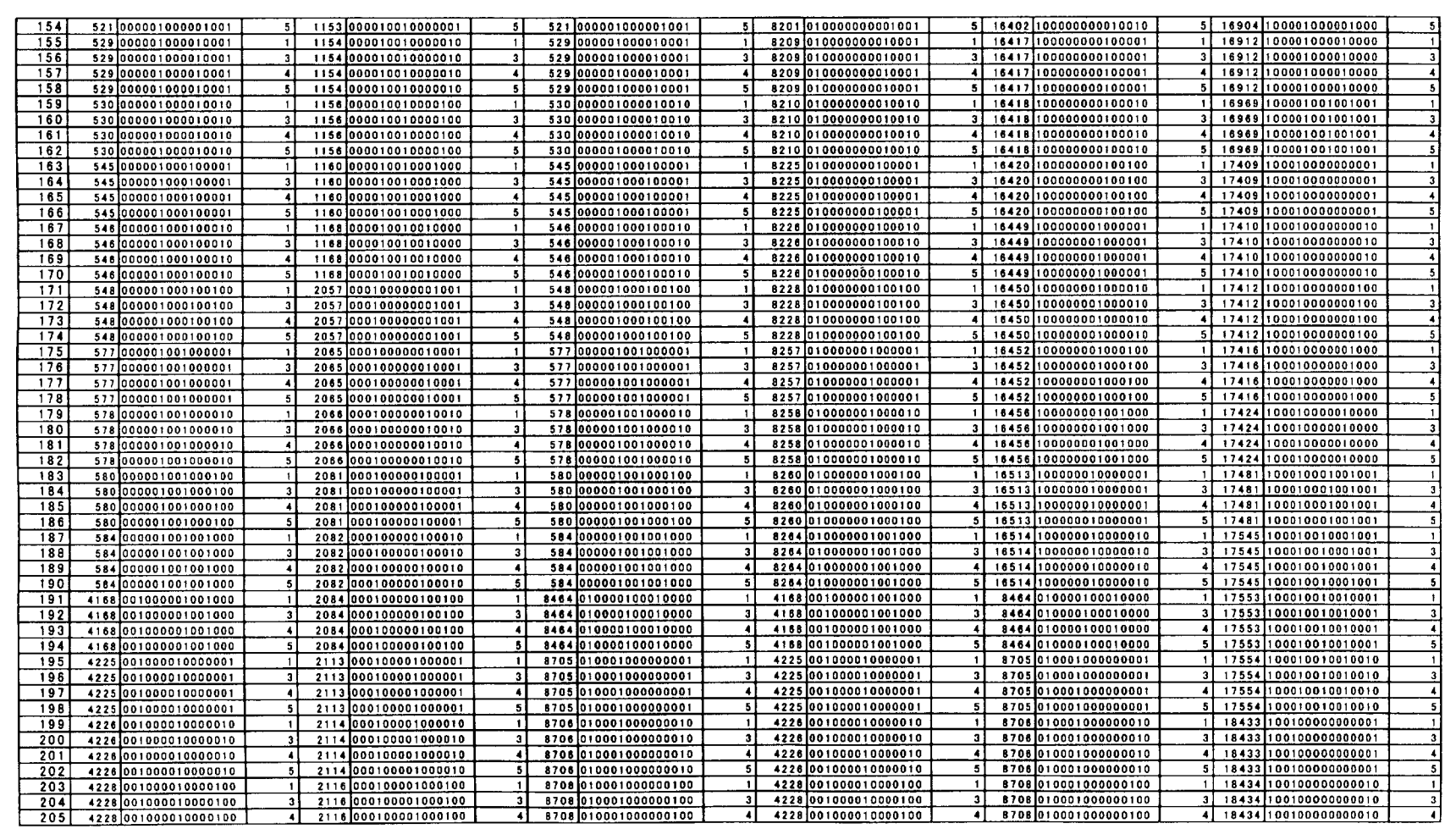
Figure 18:
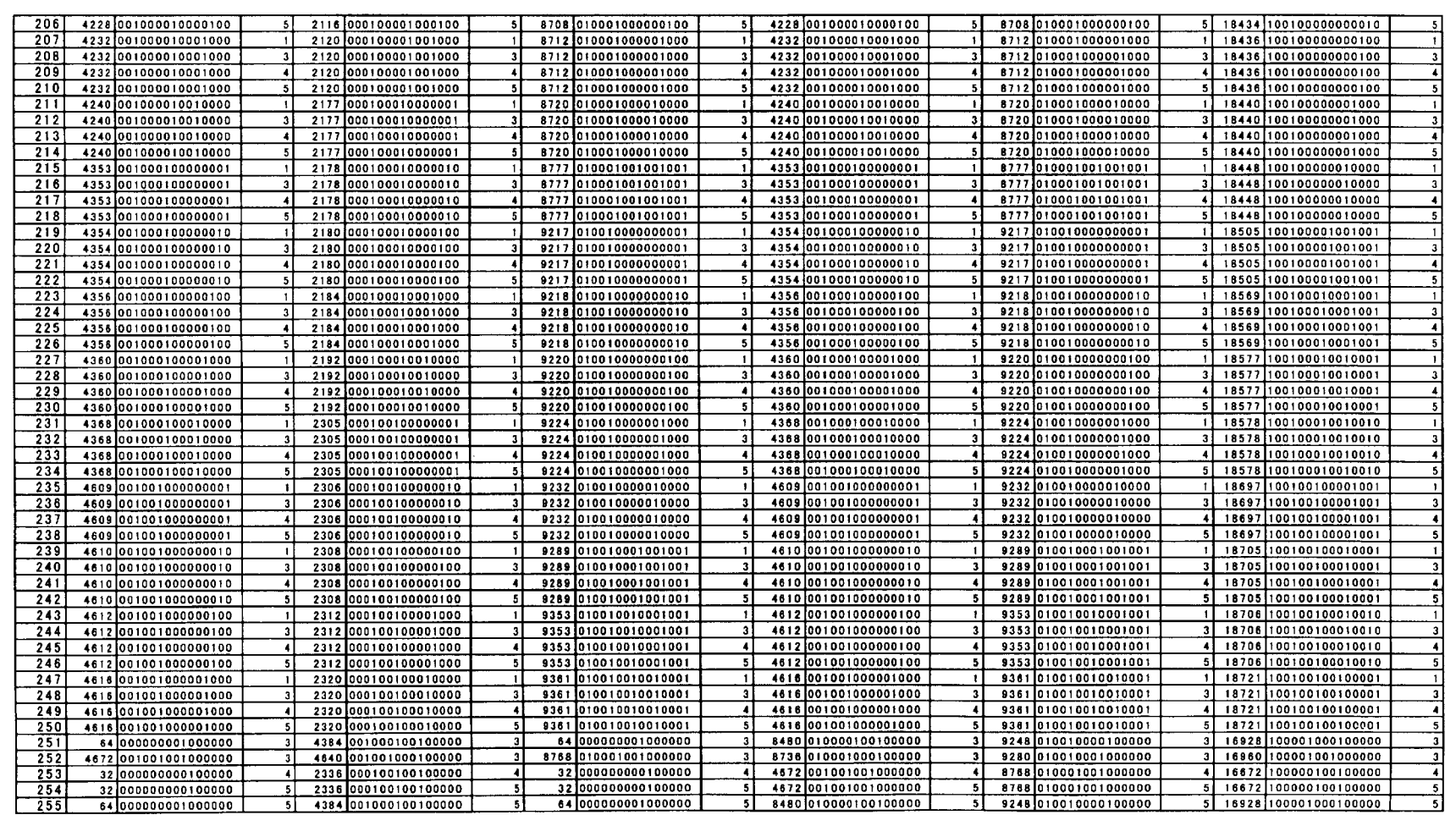

FIGS. 14, 15, 16, 17, and 18 are diagrams showing an example of the contents of second substitution encoding tables in FIGS. 1 and 2.

FIG. 24 is a diagram of the relation among a code-word case, the LSB-side zero run length of a current code word, and the state for a next code word.

FIG. 26 is an illustration of an example of a predetermined algorithm for computing an encoding state Sk which is used by a state calculator in FIG. 23.

DETAILED DESCRIPTION OF THE INVENTION

First Embodiment

Figure 1:
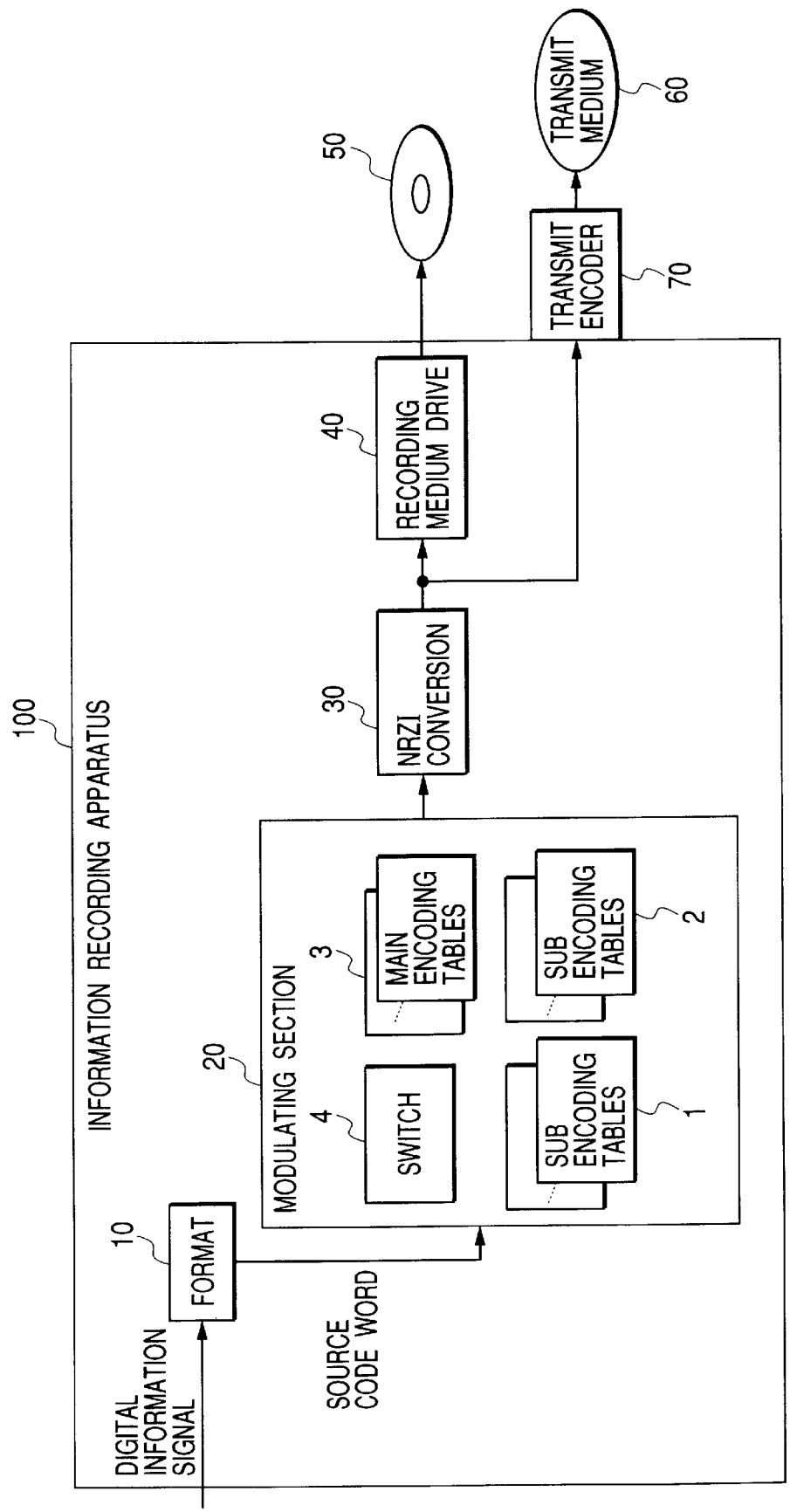
FIG. 1 is a block diagram of an information recording apparatus according to a first embodiment of this invention.

With reference to FIG. 1, an information recording apparatus 100 includes a formatting section 10, a modulating section 20, an NRZI conversion circuit 30, and a recording-medium drive circuit 40 which are sequentially connected in that order. The recording-medium drive circuit 40 can access a recording medium 50 such as an optical disc. The information recording apparatus 100 basically operates to record an input digital signal representative of audio information, video information, or audio-visual information on the recording medium 50.

The NRZI conversion circuit 30 may be followed by a transmission encoder 70 connected to a transmission medium 60. The transmission encoder 70 encodes an output signal of the NRZI conversion circuit 30 into a digital signal of a code suited for the transmission through the transmission medium 60. The transmission encoder 70 outputs the resultant transmission-code signal to the transmission medium 60. The transmission code signal propagates along the transmission medium 60.

The formatting section 10 receives the input digital signal. The formatting section 10 divides the input digital signal into equal-size blocks each having a predetermined number "p" of bits. The bit number "p" is equal to, for example, 8. In this case, the equal-size blocks are bytes respectively. The formatting section 10 successively outputs the equal-size blocks or the bytes to the modulating section 20 as input data words also called source code words.

The modulating section 20 includes a set of first substitution encoding tables (first auxiliary encoding tables) 1, a set of second substitution encoding tables (second auxiliary encoding tables) 2, a set of main encoding tables 3, and an encoding-table switcher 4. The first substitution encoding tables 1 have ID numbers (state numbers) of "0", "1", "2", . . . , "N" respectively, where N denotes a predetermined natural number equal to, for example, 5. Similarly, the second substitution encoding tables 2 have ID numbers (state numbers) of "0", "1", "2", . . . , "N" respectively. Also, the main encoding tables 3 have ID numbers (state numbers) of "0", "1", "2", . . . , "N" respectively. The switcher 4 implements change between the main encoding tables 3 and the substitution encoding tables 1 and 2.

The modulating section 20 may be formed by a digital signal processor, a CPU, or a similar device including a combination of an input/output port, a processing portion, a ROM, and a RAM. In this case, the modulating section 20 operates in accordance with a control program stored in the ROM or the RAM. The control program is designed to enable the modulating section 20 to implement operation steps mentioned hereafter.

The modulating section 20 receives source code words (input data words) from the formatting section 10, and encodes the source code words into output code words (object code words) by referring to the encoding tables 1, 2, and 3. Each of the output code words has a predetermined number "q" of bits. The bit number "q" is greater than the bit number "p". The bit number "q" is equal to, for example, 15. The modulating section 20 serially connects the output code words while adding "r" connection bits to the ends of some of the output code words. The bit number "r" of connection bits is equal to a prescribed value equal to, for example, 2. The resultant output-code-word sequence is in the form of a bit stream. The encoding by the modulating section 20 is designed so that a result of NRZI conversion of the output-code-word sequence will observe prescribed run length limiting constraints (prescribed RLL constraints) or prescribed run length limiting rules. According to an example of the prescribed run length limiting rules, a minimum run length in a result of NRZI conversion of the output-code-word sequence is 3T while a maximum run length therein is equal to 14T or less. Here, T denotes a channel bit period related to the output code words. Furthermore, the output-code-word sequence satisfies prescribed RLL constraints, for example, "RLL(2, 10)" which means run length limiting rules such that 2 to 10 successive channel bits of "0" should be between channel bits of "1". The output-code-word sequence is also referred to as encoding-resultant data. The modulating section 20 adjusts the encoding of source code words into output code words for DSV (digital sum value or digital sum variation) control. The modulating section 20 outputs the encoding-resultant data to the NRZI conversion circuit 30.

The NRZI conversion circuit 30 subjects the encoding-resultant data to NRZI modulation to generate modulation-resultant data of an NRZI code. The modulation-resultant data are sent from the NRZI conversion circuit 30 to at least one of the recording-medium drive circuit 40 and the transmission encoder 70. The recording-medium drive circuit 40 records the modulation-resultant data on the recording medium 50, for example, the optical disc. The transmission encoder 70 encodes the modulation-resultant data into a digital signal of a code suited for the transmission through the transmission medium 60. The transmission encoder 70 outputs the resultant transmission-code signal to the transmission medium 60. The transmission code signal propagates along the transmission medium 60.

Figure 2:
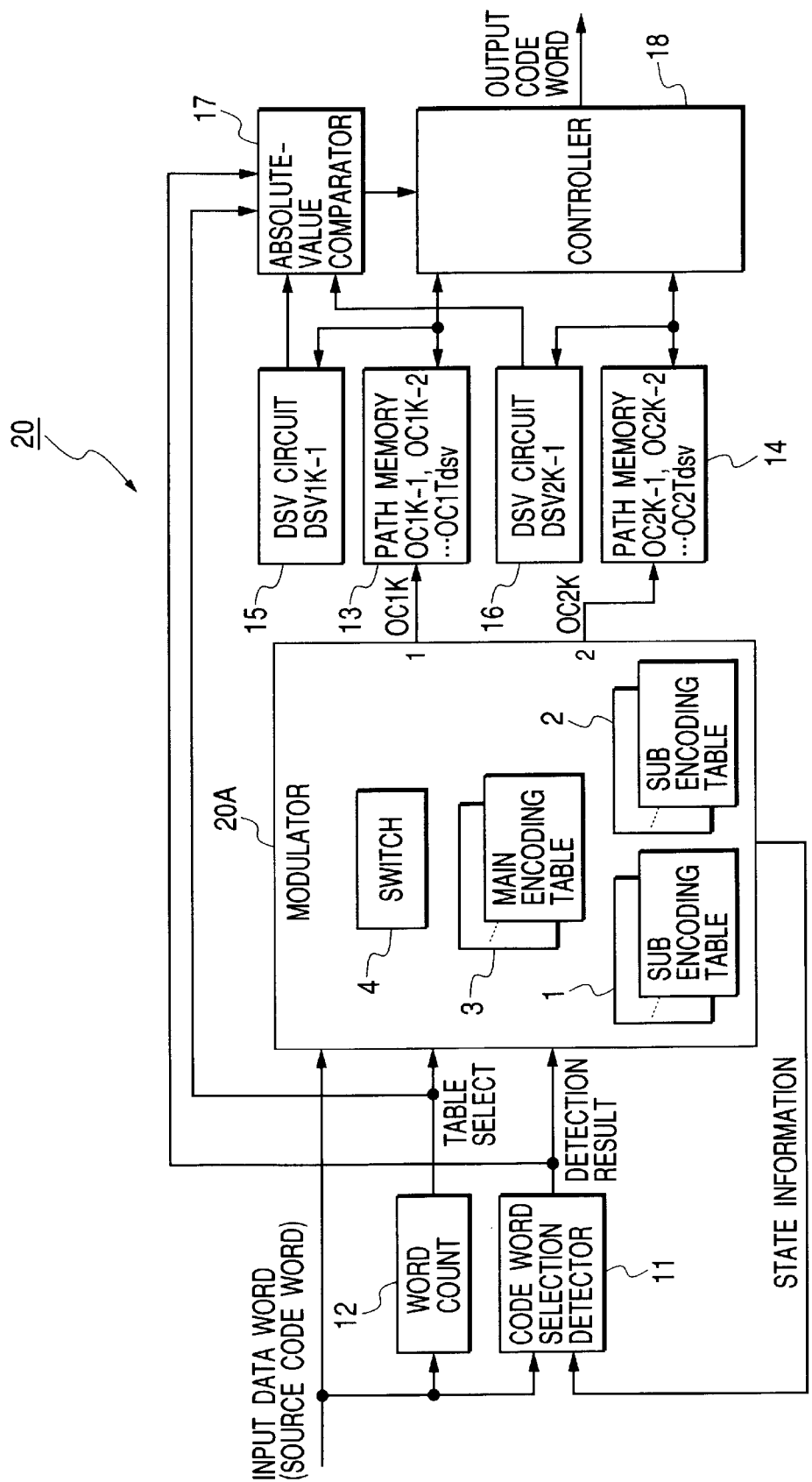
FIG. 2 is a block diagram of a modulating section in FIG. 1.

As shown in FIG. 2, the modulating section 20 includes a code-word-selection detector 11, a word counter 12, an absolute-value comparator 17, and a modulator 20A. The code-word-selection detector 11 is connected with the absolute-value comparator 17 and the modulator 20A. The word counter 12 is connected with the absolute-value comparator 17 and the modulator 20A. The modulator 20A has the encoding tables 1, 2, and 3, and the encoding-table switcher 4.

The modulator 20A sequentially receives source code words (input data words) from the formatting section 10 (see FIG. 1). The modulator 20A includes a sync-word generator which adds a sync word to every prescribed number of source code words in response to a clock signal. The sync word has a predetermined bit pattern. There is a state-information number Sk normally originating from a next-table selection number Sk+1. Generally, the state-information number Sk for a source code word immediately following a sync word is fixed or predetermined.

The code-word-selection detector 11 receives source code words from the formatting section 10 (see FIG. 1). The code-word-selection detector 11 is notified of a state-information number Sk (a next-table selection number Sk+1) by the modulator 20A. The code-word-selection detector 11 decides whether or not a code-word selection is performed for a current source code word inputted into the modulator 20A on the basis of parameters including the current source code word and the state-information number Sk. The code-word-selection detector 11 notifies the modulator 20A and the absolute-value comparator 17 of the decision result.

The word counter 12 receives source code words from the formatting section 10 (see FIG. 1). The word counter 12 counts the source code words, and decides whether or not the word count number reaches a prescribed number. When the word count number differs from the prescribed number, the word counter 12 outputs an encoding-table selection signal of "1" to the modulator 20A as a main-encoding-table selection signal. In addition, the word counter 12 outputs the signal of "1" to the absolute-value comparator 17 as a signal indicating the absence of a word selection. When the word count number reaches the prescribed number, the word counter 12 outputs an encoding-table selection signal of "0" to the modulator 20A as a substitution-encoding-table selection signal. In addition, the word counter 12 outputs the signal of "0" to the absolute-value comparator 17 as a signal indicating the presence of a word selection. Then, the word counter 12 resets the word count number to zero, and restarts the word count.

The encoding-table switcher 4 in the modulator 20A causes the main encoding tables 3 to be used for the encoding of a source code word in response to the main-encoding-table selection signal outputted from the word counter 12. The encoding-table switcher 4 replaces the main encoding tables 3 with the first and second substitution encoding tables 1 and 2 in response to the substitution-encoding-table selection signal outputted from the word counter 12. When the main encoding tables 3 are replaced with the first and second substitution encoding tables 1 and 2, the encoding of a source code word is executed by referring to the first and second substitution encoding tables 1 and 2 instead of the main encoding tables 3.

Figure 3:
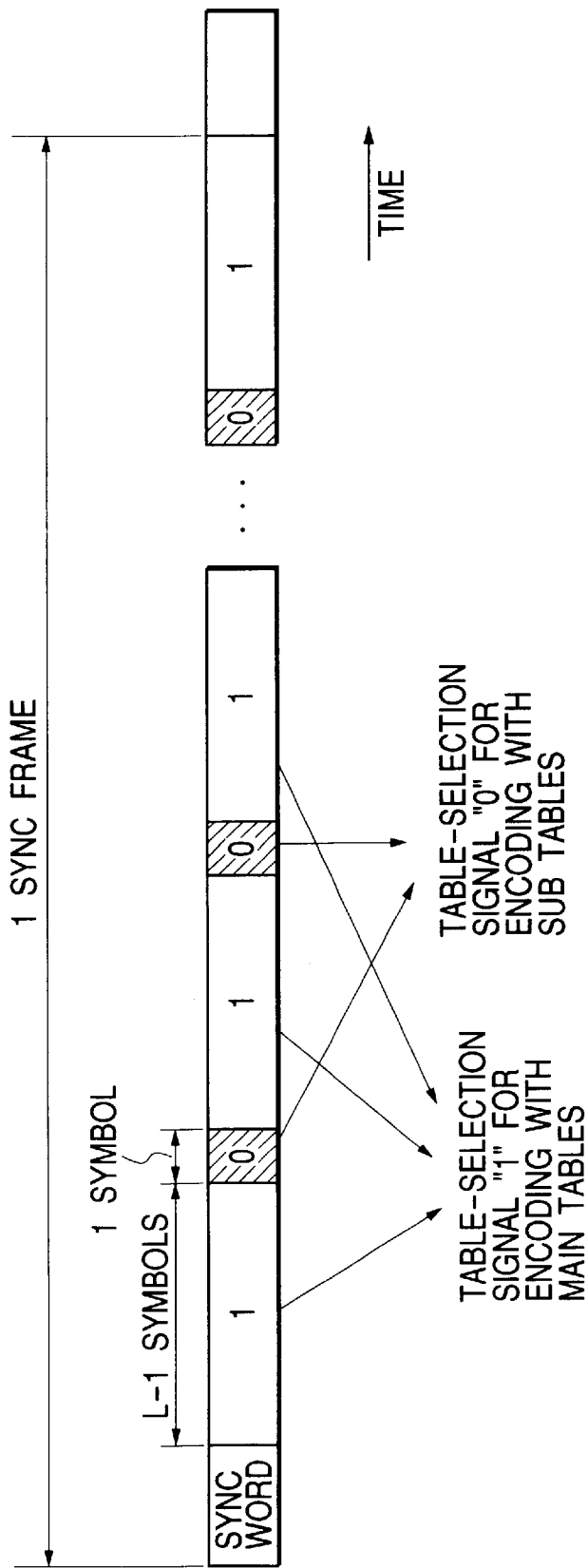
FIG. 3 is a time-domain diagram of a sync frame including a sync word and successive symbols.

Source code words are handled as symbols (for example, bytes). The sync-word generator in the modulator 20A adds a sync word to every prescribed number of source code words (symbols) to form a sync frame. As shown in FIG. 3, one sync frame includes a sync word, and symbols successively following the sync word. In more detail, one sync frame except for a sync word has sequential groups each having a predetermined number L of successive symbols. Regarding each group, the encoding-table selection signal (the output signal of the word counter 12) for the last symbol is "0" so that the last symbol is assigned to the substitution encoding tables 1 and 2. On the other hand, the encoding-table selection signal for the L-1 symbols preceding the last symbol are "1" so that the L-1 symbols are assigned to the main encoding tables 3. Therefore, the encoding of a source code word by referring to the substitution encoding tables 1 and 2 is executed once per L symbols. On the other hand, the encoding of a source code word by referring to the main encoding tables 3 is executed L-1 times per L symbols. In every sync frame, the encodings of source code words by referring to the substitution encoding tables 1 and 2 occupy time positions having a fixed relation with the timing of a sync word. This relation can be utilized by a decoder side (a demodulation side).

As previously mentioned, the encoding of a source code word by referring to the main encoding tables 3 is executed when the encoding-table selection signal outputted from the word counter 12 is "1". On the other hand, the encoding of a source code word by referring to the substitution encoding tables 1 and 2 is executed when the encoding-table selection signal is "0". The word counter 12 implements the count of symbols, and detects when the symbol count number reaches the predetermined number L. The word counter 12 sets the encoding-table selection signal to "0" when the symbol count number reaches the predetermined number L. Normally, the word counter 12 sets the encoding-table selection signal to "1".

FIGS. 4, 5, 6, 7, and 8 show an example of the contents of the main encoding tables 3 having ID numbers (state numbers) of "0", "1", "2", "3", "4", and "5" respectively. The main encoding tables 3 contain arrays of cells each having a set of an input data word Dk, an output code word Ck assigned to the input data word Dk, and a next-table selection number (a state-information number) Sk+1 accompanying the output code word Ck. In FIGS. 4–8, each input data word Dk is expressed by the decimal notation while each output code word Ck is expressed by both the decimal notion "Ck(10)" and the binary notation "Ck(2)". Each next-table selection number Sk+1 designates an encoding table used next as explained hereafter. Under normal conditions, when the next-table selection number Sk+1 accompanying the current output code word Ck is "0", an encoding table having an ID number of "0" is used to generate a next output code word. When the next-table selection number Sk+1 accompanying the current output code word Ck is "1", an encoding table having an ID number of "1" is used to generate a next output code word. When the next-table selection number Sk+1 accompanying the current output code word Ck is "2", an encoding table having an ID number of "2" is used to generate a next output code word. When the next-table selection number Sk+1 accompanying the current output code word Ck is "3", an encoding table having an ID number of "3" is used to generate a next output code word. When the next-table selection number Sk+1 accompanying the current output code word Ck is "4", an encoding table having an ID number of "4" is used to generate a next output code word. When the next-table selection number Sk+1 accompanying the current output code word Ck is "5", an encoding table having an ID number of "5" is used to generate a next output code word. A next-table selection number accompanying an output code word Ck−1 immediately preceding the current output code word Ck is defined as a current-table selection number or a state-information number Sk used for the generation of the current output code word Ck in response to a current input data word. The next-table selection numbers Sk+1 are designed so that the NRZI modulation result of a sequence of selected output code words will follow the predetermined run length limiting rules providing the run length range of, for example, 3T–11T (corresponding to, for example, the before-NRZI-conversion rules "RLL(2, 10)"), 3T–12T, 3T–13T, or 3T–14T.

The main encoding table 3 having an ID number of "0" and the main encoding table 3 having an ID number of "3" are in a prescribed relation as follows. The NRZI modulation results of output code words assigned to input data words of "0" to "38" in the main encoding table 3 having an ID number of "0" are opposite in polarity (DSV-related polarity corresponding to "odd-even" in the number of "1" in one word) to those of output code words in the main encoding table 3 having an ID number of "3". Thereby, initial values at the time of NRZI conversion of a next output code word which relate to these main encoding tables 3 can be different from each other. Furthermore, the opposite polarities cause a DSV (digital sum value or digital sum variation) in an increasing direction and a DSV in a decreasing direction, respectively.

The main encoding table 3 having an ID number of "2" and the main encoding table 3 having an ID number of "4" are in a prescribed relation as follows. The NRZI modulation results of output code words assigned to input data words of "0" to "11" and "26" to "47" in the main encoding table 3 having an ID number of "2" are opposite in polarity (DSV-related polarity corresponding to "odd-even" in the number of "1" in one word) to those of output code words in the main encoding table 3 having an ID number of "4". Thereby, initial values at the time of NRZI conversion of a next output code word which relate to these main encoding tables 3 can be different from each other. Furthermore, the opposite polarities cause a DSV in an increasing direction and a DSV in a decreasing direction, respectively.

FIGS. 9, 10, 11, 12, and 13 show an example of the contents of the first substitution encoding tables 1 having ID numbers (state numbers) of "0", "1", "2", "3", "4", and "5" respectively. The first substitution encoding tables 1 contain arrays of cells each having a set of an input data word Dk, an output code word Ck assigned to the input data word Dk, and a next-table selection number (a state-information number) Sk+1 accompanying the output code word Ck. In FIGS. 9–13, each input data word Dk is expressed by the decimal notation while each output code word Ck is expressed by both the decimal notion "Ck(10)" and the binary notation "Ck(2)". Each next-table selection number Sk+1 designates an encoding table used next.

FIGS. 14, 15, 16, 17, and 18 show an example of the contents of the second substitution encoding tables 2 having ID numbers (state numbers) of "0", "1", "2", "3", "4", and "5" respectively. The second substitution encoding tables 2 contain arrays of cells each having a set of an input data word Dk, an output code word Ck assigned to the input data word Dk, and a next-table selection number (a state-information number) Sk+1 accompanying the output code word Ck. In FIGS. 14–18, each input data word Dk is expressed by the decimal notation while each output code word Ck is expressed by both the decimal notion "Ck(10)" and the binary notation "Ck(2)". Each next-table selection number Sk+1 designates an encoding table used next.

The first substitution encoding tables 1 in FIGS. 9–13 and the second substitution encoding tables in FIGS. 14–18 are designed as follows. The first and second substitution encoding tables 1 and 2 are equal in the assignment of input data words Dk to next-table selection numbers (state-information numbers) Sk+1. Output code words Ck except ones assigned to input data words Dk of "106" to "108" in the first substitution encoding tables 1 are opposite in NRZI-conversion-result DSV parity (DSV polarity) to those in the second substitution encoding tables 2.

As shown in FIG. 2, the modulating section 20 further includes two path memories 13 and 14, DSV circuits 15 and 16, and a controller 18. The path memories 13 and 14 follow the modulator 20A. The path memories 13 and 14 are assigned to first and second paths, respectively. The DSV circuit 15 is connected with the path memory 13, the absolute-value comparator 17, and the controller 18. The DSV circuit 16 is connected with the path memory 14, the absolute-value comparator 17, and the controller 18. The absolute-value comparator 17 is connected with the code-word-selection detector 11, the word counter 12, and the controller 18. The controller 18 is connected with the path memories 13 and 14. The controller 18 is followed by the NRZI conversion circuit 30 (see FIG. 1).

Operation of the modulating section 20 in FIG. 2 will be further explained. The modulator 20A generates a sync word at a specified timing decided by the clock signal. The modulator 20A sets the state-information number Sk to a predetermined value in response to the sync word. The modulator 20A notifies the code-word-selection detector 11 of the state-information number Sk. Furthermore, the modulator 20A generates a predetermined sync bit pattern in response to the sync word. The modulator 20A stores the sync bit pattern into the path memories 13 and 14 as current output code words OC1$k$ and OC2$k$ respectively. The modulator 20A may notify the code-word-selection detector 11 of the output code word OC1$k$ or OC2$k$ as the latest output code word.

The DSV circuit 15 calculates the DSV value of the sync bit pattern in the path memory 13, and updates a DSV-indicating variable DSV1k−1 in accordance with the calculated sync DSV value. The DSV circuit 16 calculates the DSV value of the sync bit pattern in the path memory 14, and updates a DSV-indicating variable DSV2k−1 in accordance with the calculated sync DSV value.

The code-word-selection detector 11 receives every input data word Dk from the formatting section 10 (see FIG. 1). The code-word-selection detector 11 receives a signal representative of the state-information number Sk from the modulator 20A. In addition, the code-word-selection detector 11 is notified of the latest output code word, that is, an output code word for the immediately-preceding input data word Dk−1 which is given by the modulating section 20. The code-word-selection detector 11 decides whether or not the received input data word Dk, the state-information number Sk, and the latest output code word satisfy one of predetermined conditions "1", "2", and "3" for the execution of DSV control. The code-word-selection detector 11 notifies the modulator 20A and the absolute-value comparator 17 of the decision result. When one of predetermined conditions "1", "2", and "3" is satisfied, the decision result indicates the presence of a word selection. Otherwise, the decision result indicates the absence of a word selection.

The modulator 20A receives every input data word Dk from the formatting section 10 (see FIG. 1). The modulator 20A receives the encoding-table selection signal from the word counter 12. In the case where the code-word-selection detector 11 notifies the modulator 20A that one of the predetermined conditions "1", "2", and "3" is satisfied, when the encoding-table selection signal is "1", the modulator 20A generates two different values Sk(1) and Sk(2) from the state-information number Sk. In response to the received input data word Dk, the modulator 20A accesses two among the main encoding tables 3 which have ID numbers equal to the values Sk(1) and Sk(2). The modulator 20A reads out, from the main encoding table having an ID number equal to the value Sk(1), an output code word Ck1 assigned to the received input data word Dk. The modulator 20A stores the read-out output code word Ck1 into the path memory 13 as a candidate current output code word OC1$k$. The modulator 20A reads out, from the main encoding table having an ID number equal to the value Sk(2), an output code word Ck2 assigned to the received input data word Dk. The modulator 20A stores the read-out output code word Ck2 into the path memory 14 as a candidate current output code word OC2k. The modulator 20A may notify the code-word-selection detector 11 of the output code words OC1k and OC2k as the latest output code words.

In the case where the code-word-selection detector 11 notifies the modulator 20A that none of the predetermined conditions "1", "2", and "3" is satisfied, when the encoding-table selection signal is "1", the modulator 20A accesses one among the main encoding tables 3 which has an ID number equal to the state-information value Sk in response to the received input data word Dk. The modulator 20A reads out, from the main encoding table having an ID number equal to the state-information value Sk, an output code word Ck assigned to the received input data word Dk. The modulator 20A stores the read-out output code word Ck into both the path memories 13 and 14 as current output code words OC1k and OC2k. In this case, the current output code words OC1k and OC2k are the same. The modulator 20A may notify the code-word-selection detector 11 of the output code word OC1k or OC2k as the latest output code word. The output code words OC1k and OC2k in the path memories 13 and 14 are denoted by "OC1k−1" and "OC1k−2", respectively.

The modulator 20A also reads out, from the accessed main encoding table 3 (or one of the accessed main encoding tables 3), the next-table selection number accompanying the current output code word. The modulator 20A sets the state-information number Sk to the read-out next-table selection number. The modulator 20A notifies the code-word-selection detector 11 of the resultant state-information number Sk.

Immediately before candidate output code words are stored into the path memories 13 and 14, DSV control is implemented as follows. Each time a current output code word OC1k has been written into the path memory 13, the DSV circuit 15 updates the DSV value DSV1k−1 in response to the written output code word. The written output code word in the path memory 13 is denoted by "OC1k−1". Normally, a succession of output code words OC1k−1, OC1k−2, ..., OC1Tdsv is in the path memory 13, where "Tdsv" denotes the moment of the occurrence of the last code-word selection and "k−1" denotes the moment corresponding to the newest output code word OC1k−1 in the path memory 13. Generally, the oldest output code word OC1Tdsv in the path memory 13 is candidate one. The updated DSV value DSV1k−1 relates to the succession of output code words OC1k−1, OC1k−2, ..., OC1Tdsv in the path memory 13. The DSV circuit 15 notifies the absolute-value comparator 17 of the updated DSV value DSV1k−1.

Each time a current output code word OC2k has been written into the path memory 14, the DSV circuit 16 updates the DSV value DSV2k−1 in response to the written output code word. The written output code word in the path memory 14 is denoted by "OC2k−1". Normally, a succession of output code words OC2k−1, OC2k−2, ..., OC2Tdsv is in the path memory 14. Generally, the oldest output code word OC2Tdsv in the path memory 14 is candidate one. The updated DSV value DSV2k−1 relates to the succession of output code words OC2k−1, OC2k−2, ..., OC2Tdsv in the path memory 14. The DSV circuit 16 notifies the absolute-value comparator 17 of the updated DSV value DSV2k−1.

The absolute-value comparator 17 responds to the output signal from the code-word-selection detector 11. When the output signal from the code-word-selection detector 11 indicates the presence of a word selection, the absolute-value comparator 17 calculates the absolute DSV values |DSV1k−1| and |DSV2k−1| and compares the absolute DSV values |DSV1k−1| and |DSV2k−1| to decide which of the two is smaller. The absolute-value comparator 17 notifies the controller 18 of the comparison result.

When the absolute-value comparator 17 notifies the controller 18 that the absolute DSV value |DSV1k−1| is equal to or smaller than the absolute DSV value |DSV2k−1|, the controller 18 transfers the output code words OC1k−1, OC1k−2, ..., OC1Tdsv from the path memory 13 to the NRZI conversion circuit 30 (see FIG. 1) as finally-selected output code words. At the same time, the controller 18 may clear the path memory 14. When the absolute-value comparator 17 notifies the controller 18 that the absolute DSV value |DSV1k−1| is greater than the absolute DSV value |DSV2k−1|, the controller 18 transfers the output code words OC2k−1, OC2k−2, ..., OC2Tdsv from the path memory 14 to the NRZI conversion circuit 30 as finally-selected output code words. At the same time, the controller 18 may clear the path memory 13.

In the case where the absolute DSV value |DSV1k−1| is equal to or smaller than the absolute DSV value |DSV2k−1|, the controller 18 orders the DSV circuits 15 and 16 to update the DSV value DSV2k−1 to the DSV value DSV1k−1. On the other hand, in the case where the absolute DSV value |DSV1k−1| is greater than the absolute DSV value DSV2k−1|, the controller 18 orders the DSV circuits 15 and 16 to update the DSV value DSV1k−1 to the DSV value DSV2k−1.

When the encoding-table selection signal is "0", the modulator 20A implements the encoding of the received input data word Dk by referring to the substitution encoding tables 1 and 2. In response to the received input data word Dk, the modulator 20A accesses ones of the substitution encoding tables 1 and 2 which have ID numbers equal to the state-information number Sk. The modulator 20A reads out an output code word Ck1 assigned to the received input data word Dk from the first substitution encoding table 1 having an ID number equal to the state-information number Sk. The modulator 20A generates first-path connection bits in response to the received input data word Dk. The bit number "r" of the first-path connection bits is equal to, for example, 2. The modulator 20A connects the first-path connection bits to the end of the read-out output code word Ck1 to form an extended output code word Ck1E. The modulator 20A stores the extended output code word Ck1E into the path memory 13 as a candidate current output code word OC1k. In addition, the modulator 20A reads out an output code word Ck2 assigned to the received input data word Dk from the second substitution encoding table 2 having an ID number equal to the state-information number Sk. The modulator 20A generates second-path connection bits in response to the received input data word Dk. The bit number "r" of the second-path connection bits is equal to, for example, 2. The modulator 20A connects the second-path connection bits to the end of the read-out output code word Ck2 to form an extended output code word Ck2E. The modulator 20A stores the extended output code word Ck2E into the path memory 14 as a candidate current output code word OC2k. The modulator 20A may notify the code-word-selection detector 11 of the output code words OC1k and OC2k as the latest output code words. The output code words OC1k and OC2k in the path memories 13 and 14 are denoted by "OC1k−1" and "OC1k−2", respectively.

The modulator 20A reads out, from the accessed substitution encoding table 1 or 2, the next-table selection number accompanying the latest output code word. The modulator 20A sets the state-information number Sk to the read-out next-table selection number. The modulator 20A notifies the code-word-selection detector 11 of the state-information number Sk.

Immediately before extended output code words are stored into the path memories 13 and 14, DSV control is implemented as follows. Each time a current output code word OC1k has been written into the path memory 13, the DSV circuit 15 updates the DSV value DSV1k−1 in response to the written output code word. The written output code word in the path memory 13 is denoted by "OC1k−1". Normally, a succession of output code words OC1k−1, OC1k−2, . . . , OC1Tdsv is in the path memory 13. The updated DSV value DSV1k−1 relates to the succession of output code words OC1k−1, OC1k−2, . . . , OC1Tdsv in the path memory 13. The DSV circuit 15 notifies the absolute-value comparator 17 of the updated DSV value DSV1k−1.

Each time a current output code word OC2k has been written into the path memory 14, the DSV circuit 16 updates the DSV value DSV2k−1 in response to the written output code word. The written output code word in the path memory 14 is denoted by "OC2k−1". Normally, a succession of output code words OC2k−1, OC2k−2, . . . . , OC2Tdsv is in the path memory 14. The updated DSV value DSV2k−1 relates to the succession of output code words OC2k−1, OC2k−2, . . . , OC2Tdsv in the path memory 14. The DSV circuit 16 notifies the absolute-value comparator 17 of the updated DSV value DSV2k−1.

The absolute-value comparator 17 responds to the output signal from the word counter 12. When the output signal from the word counter 12 indicates the presence of a word selection, the absolute-value comparator 17 calculates the absolute DSV values |DSV1k−1| and |DSV2k−1| and compares the absolute DSV values |DSV1k−1| and |DSV2k−1| to decide which of the two is smaller. The absolute-value comparator 17 notifies the controller 18 of the comparison result.

When the absolute-value comparator 17 notifies the controller 18 that the absolute DSV value |DSV1k−1| is equal to or smaller than the absolute DSV value |DSV2k−1|, the controller 18 transfers the output code words OC1k−1, OC1k−2, . . . , OC1Tdsv from the path memory 13 to the NRZI conversion circuit 30 (see FIG. 1) as finally-selected output code words. At the same time, the controller 18 may clear the path memory 14. When the absolute-value comparator 17 notifies the controller 18 that the absolute DSV value |DSV1k−1| is greater than the absolute DSV value |DSV2k−1|, the controller 18 transfers the output code words OC2k−1, OC2k−2, . . . , OC2Tdsv from the path memory 14 to the NRZI conversion circuit 30 as finally-selected output code words. At the same time, the controller 18 may clear the path memory 13.

In the case where the absolute DSV value |DSV1k−1| is equal to or smaller than the absolute DSV value |DSV2k−1|, the controller 18 orders the DSV circuits 15 and 16 to update the DSV value DSV2k−1 to the DSV value DSV1k−1. On the other hand, in the case where the absolute DSV value |DSV1k−1| is greater than the absolute DSV value |DSV2k−1|, the controller 18 orders the DSV circuits 15 and 16 to update the DSV value DSV1k−1 to the DSV value DSV2k−1.

It should be noted that the controller 18 may be modified to operate as follows. During the encoding of input data words into output code words and the writing of the output code words into the path memories 13 and 14, the controller 18 does not transfer the output code words from the path memories 13 and 14 to the NRZI conversion circuit 30 (see FIG. 1). After the encoding of all input data words into output code words and the writing of the output code words into the path memories 13 and 14 have been completed, the controller 18 serially transfers the output code words from the path memory 13 or the path memory 14 to the NRZI conversion circuit 30. During the encoding of input data words into output code words and the writing of the output code words into the path memories 13 and 14, when the absolute DSV value |DSV1k−1| is equal to or smaller than the absolute DSV value |DSV2k−1|, the controller 18 replaces the contents of the output code words OC2k−1, OC2k−2, . . . , OC2Tdsv in the path memory 14 with the contents of the output code words OC1k−1, OC1k−2, . . . , OC1Tdsv in the path memory 13. On the other hand, when the absolute DSV value |DSV1k−1| is greater than the absolute DSV value |DSV2k−1|, the controller 18 replaces the contents of the output code words OC1k−1, OC1k−2, . . . , OC1Tdsv in the path memory 13 with the contents of the output code words OC2k−1, OC2k−2, . . . , OC2Tdsv in the path memory 14.

As previously mentioned, the modulating section 20 may be formed by a digital signal processor, a CPU, or a similar device including a combination of an input/output port, a processing portion, a ROM, and a RAM. In this case, the modulating section 20 operates in accordance with a control program stored in the ROM or the RAM.

Figure 19:
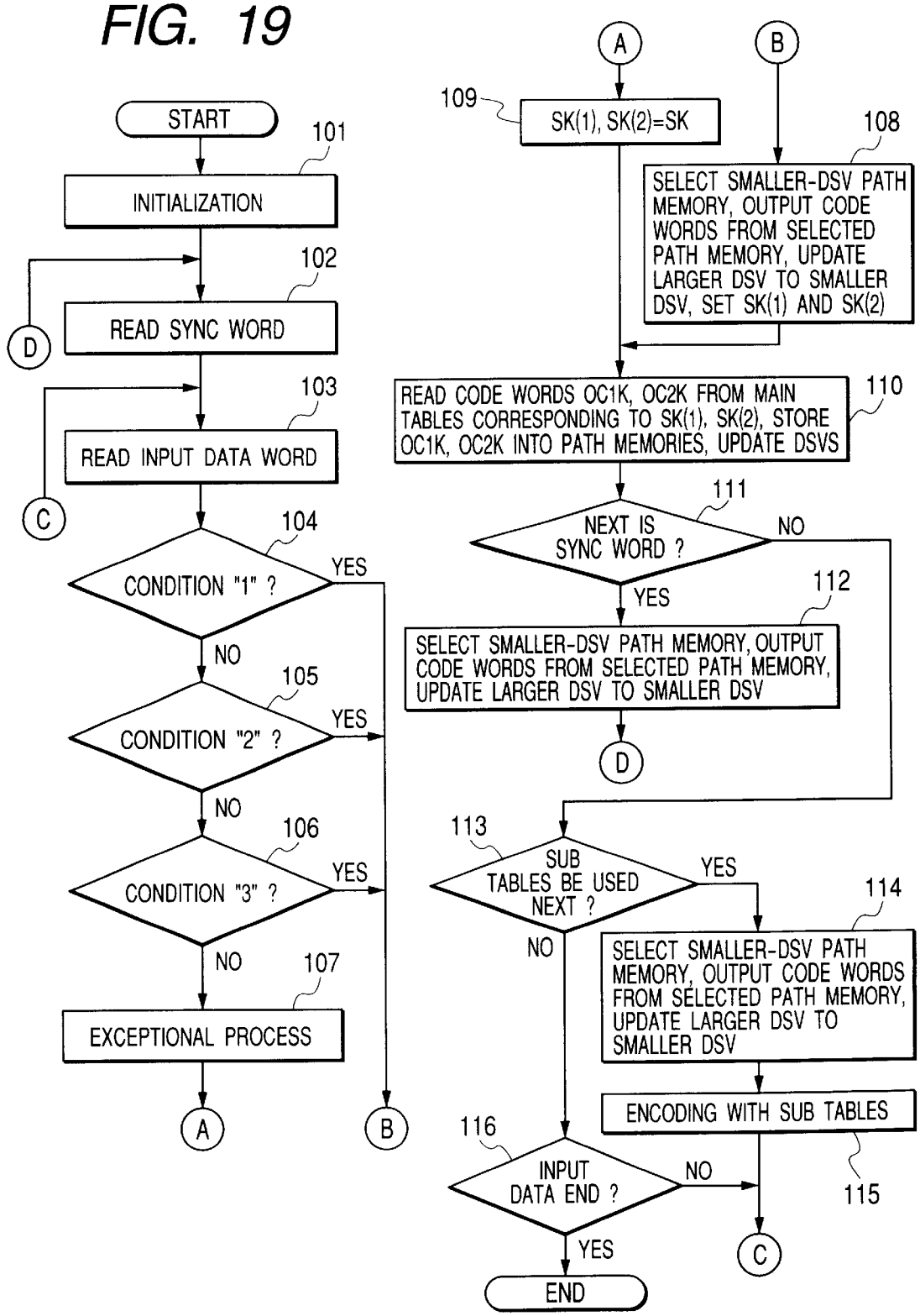
FIG. 19 is a flowchart of a segment of a control program for the modulating section in FIG. 1.

FIG. 19 is a flowchart of a segment of the control program for the modulating section 20. As shown in FIG. 19, a first step 101 of the program segment clears the path memories 13 and 14. In addition, the step 101 initializes DSV-indicating values DSV1 and DSV2 (DSV1k−1 and DSV2k−1), and a state-information number (a current-table selection number) Sk. After the step 101, the program advances to a step 102.

The step 102 receives an input data word Dk being to a sync word. The step 102 sets the state-information number Sk to a predetermined value in response to the sync word. Furthermore, the step 102 generates a predetermined sync bit pattern in response to the sync word. The step 102 stores the sync bit pattern into the path memories 13 and 14 as current output code words OC1k and OC2k respectively. The output code words OC1k and OC2k in the path memories 13 and 14 are denoted by "OC1k−1" and "OC2k−1", respectively. The step 102 calculates the DSV value of the sync bit pattern in the path memories 13 and 14, and updates the values DSV1 and DSV2 in accordance with the calculated sync DSV value. After the step 102, the program advances to a step 103.

The step 103 receives a next input data word Dk. A step 104 following the step 103 decides whether or not the received input data word Dk and the state-information number (the current-table selection number) Sk satisfy a predetermined condition "1" for the execution of DSV control. The predetermined condition "1" is "(Sk=0)&&(Dk<39)", where "&&" denotes "and". Specifically, the predetermined condition "1" is that the state-information number Sk is "0" and the received input data word Dk is in the range of "0" to "38". When the predetermined condition "1" is satisfied, the program advances from the step 104 to a step 108. Otherwise, the program advances from the step 104 to a step 105.

The step 105 decides whether or not the received input data word Dk and the state-information number Sk satisfy a predetermined condition "2" for the execution of DSV control. The predetermined condition "2" is "((Sk=2)&&(Dk<12)||((Dk>25)&&(Dk<48)))", where "||" denotes "or". Specifically, the predetermined condition "2" is that the state-information number Sk is "2" and the received input data word Dk is in the range of "0" to "11 and "26" to "47".

When the predetermined condition "2" is satisfied, the program advances from the step 105 to the step 108. Otherwise, the program advances from the step 105 to a step 106.

The step 106 decides whether or not the received input data word Dk, the state-information number Sk, and other parameters satisfy a predetermined conditions "3" for the execution of DSV control. The predetermined condition "3" is "(ZR>2)&&(Sk=3)&&(Dk<155)&&(NRZI conversion result satisfies run length limiting rules corresponding to k=10 even if the state-information number Sk is changed from "3" to "0")", where "k" denotes one in "RLL(2, k)" and ZR denotes the zero run length of the LSB side of the latest output code word. Specifically, the predetermined condition "3" is that the zero run length of the LSB side of the latest output code word is "2" or greater; the state-information number Sk is "3"; the received input data word Dk is smaller than "155"; and the NRZI conversion result satisfies the run length limiting rules providing the run length range of 3T–11T even if the state-information number Sk is changed from "3" to "0". Here, T denotes a channel bit period. In this case, the NRZI conversion result is provided in, for example, the following way. Access is given to the main encoding table 3 having an ID number equal to a state-information number Sk of "0". The output code word assigned to the received input data word Dk is read out from the accessed main encoding table 3. A succession of the latest output code word and the read-out output code word is subjected to NRZI conversion. When the predetermined condition "3" is satisfied, the program advances from the step 106 to the step 108. Otherwise, the program advances from the step 106 to a step 107.

The step 107 decides whether or not each of exceptional conditions "1" and "2" is satisfied. The exceptional condition "1" is "(ZR>6)&&(Sk=3)&&(Dk=255)". Specifically, the exceptional condition "1" is that the zero run length of the LSB side of the latest output code word is greater than "6", and the state-information number Sk is "3" and the received input data word Dk is "255". The exceptional condition "2" is "(ZR=7 or 8)&&(Sk=4)&&(Dk=255)". Specifically, the exceptional condition "2" is that the zero run length of the LSB side of the latest output code word is "7" or "8", and the state-information number Sk is "4" and the received input data word Dk is "255". When the exceptional condition "1" is satisfied, the step 107 changes the state-information number Sk to "2". When the exceptional condition "2" is satisfied, the step 107 changes the state-information number Sk to "1". When neither the exceptional condition "1" nor the exceptional condition "2" is satisfied, the step 107 keeps the state-information number Sk unchanged.

A step 109 following the step 107 sets values Sk(1) and Sk(2) to the state-information number Sk. After the step 109, the program advances to a step 110.

The step 108 calculates the absolute values |DSV1| and |DSV2|. The step 108 compares the absolute values |DSV1| and |DSV2| to decide which of the two is smaller. When the absolute value |DSV1| is equal to or smaller than the absolute value |DSV2|, the step 108 transfers output code words OC1k-1, OC1k-2, . . . , OC1Tdsv from the path memory 13 to the NRZI conversion circuit 30 as finally-selected output code words. Here, "Tdsv" denotes the moment of the occurrence of the last code-word selection and "k-1" denotes the moment corresponding to the newest output code word OC1k-1 in the path memory 13. In addition, the step 108 updates the value DSV2 to the value DSV1. Furthermore, the step 108 may clear the path memory 14. On the other hand, when the absolute value |DSV1| is greater than the absolute value |DSV2|, the step 108 transfers output code words OC2k-1, OC2k-2, . . . , OC2Tdsv from the path memory 14 to the NRZI conversion circuit 30 as finally-selected output code words. In addition, the step 108 updates the value DSV1 to the value DSV2. Furthermore, the step 108 may clear the path memory 13.

The step 108 sets the values Sk(1) and Sk(2) to "0" and "3" respectively in the case where the step 104 has decided that the predetermined condition "1" is satisfied. The step 108 sets the values Sk(1) and Sk(2) to "2" and "4" respectively in the case where the step 105 has decided that the predetermined condition "2" is satisfied. The step 108 sets the values Sk(1) and Sk(2) to "3" and "0" respectively in the case where the step 106 has decided that the predetermined condition "3" is satisfied. After the step 108, the program advances to the step 110.

The step 110 reads out an output code word Ck1 assigned to the received input data word Dk from the main encoding table 3 having an ID number equal to the value Sk(1). The step 110 stores the read-out output code word Ck1 into the path memory 13 as a current output code word OC1k. The output code word OC1k in the path memory 13 is denoted by "OC1k-1". In addition, the step 110 reads out an output code word Ck2 assigned to the received input data word Dk from the main encoding table 3 having an ID number equal to the value Sk(2). The step 110 stores the read-out output code word Ck2 into the path memory 14 as a current output code word OC2k. The output code word OC2k in the path memory 14 is denoted by "OC2k-1". When the values Sk(1) and Sk(2) are different, the current output code words OC1k and OC2k are different candidate output code words respectively. On the other hand, when the values Sk(1) and Sk(2) are equal, the current output code words OC1k and OC2k are the same.

Furthermore, the step 110 updates the value DSV1 in response to the newest output code word OC1k-1 in the path memory 13. In addition, the step 110 updates the value DSV2 in response to the newest output code word OC2k-1 in the path memory 14.

A step 111 following the step 110 decides whether or not a next input data word is a sync word. When the next input data word is a sync word, the program advances from the step 110 to a step 112. Otherwise, the program advances from the step 110 to a step 113.

Basically, the step 112 is similar to a portion of the step 108. The step 112 calculates the absolute values |DSV1| and |DSV2|. The step 112 compares the absolute values |DSV1| and |DSV2| to decide which of the two is smaller. When the absolute value |DSV1| is equal to or smaller than the absolute value |DSV2|, the step 112 transfers output code words from the path memory 13 to the NRZI conversion circuit 30 as finally-selected output code words. In addition, the step 112 updates the value DSV2 to the value DSV1. Furthermore, the step 112 may clear the path memory 14. On the other hand, when the absolute value |DSV1| is greater than the absolute value |DSV2|, the step 112 transfers output code words from the path memory 14 to the NRZI conversion circuit 30 as finally-selected output code words. In addition, the step 112 updates the value DSV1 to the value DSV2. Furthermore, the step 112 may clear the path memory 13. After the step 112, the program returns to the step 102.

The step 113 decides whether or not the next input data word should be encoded by referring to the substitution encoding tables 1 and 2. When the next input data word should be encoded by referring to the substitution encoding tables 1 and 2, the program advances from the step 113 to a step 114. Otherwise, the program advances from the step 113 to a step 116.

The step 116 decides whether or not the received input data word Dk is final one. When the received input data word Dk is final one, the program advances from the step 116 and then the current execution cycle of the program segment ends. Otherwise, the program returns from the step 116 to the step 103.

Basically, the step 114 is similar to a portion of the step 108. The step 114 calculates the absolute values |DSV1| and |DSV2|. The step 114 compares the absolute values |DSV1| and |DSV2| to decide which of the two is smaller. When the absolute value |DSV1| is equal to or smaller than the absolute value |DSV2|, the step 114 transfers output code words from the path memory 13 to the NRZI conversion circuit 30 as finally-selected output code words. In addition, the step 114 updates the value DSV2 to the value DSV1. Furthermore, the step 114 may clear the path memory 14. On the other hand, when the absolute value |DSV1| is greater than the absolute value |DSV2|, the step 114 transfers output code words from the path memory 14 to the NRZI conversion circuit 30 as finally-selected output code words. In addition, the step 114 updates the value DSV1 to the value DSV2. Furthermore, the step 114 may clear the path memory 13. After the step 114, the program advances to a block 115.

Figure 20:
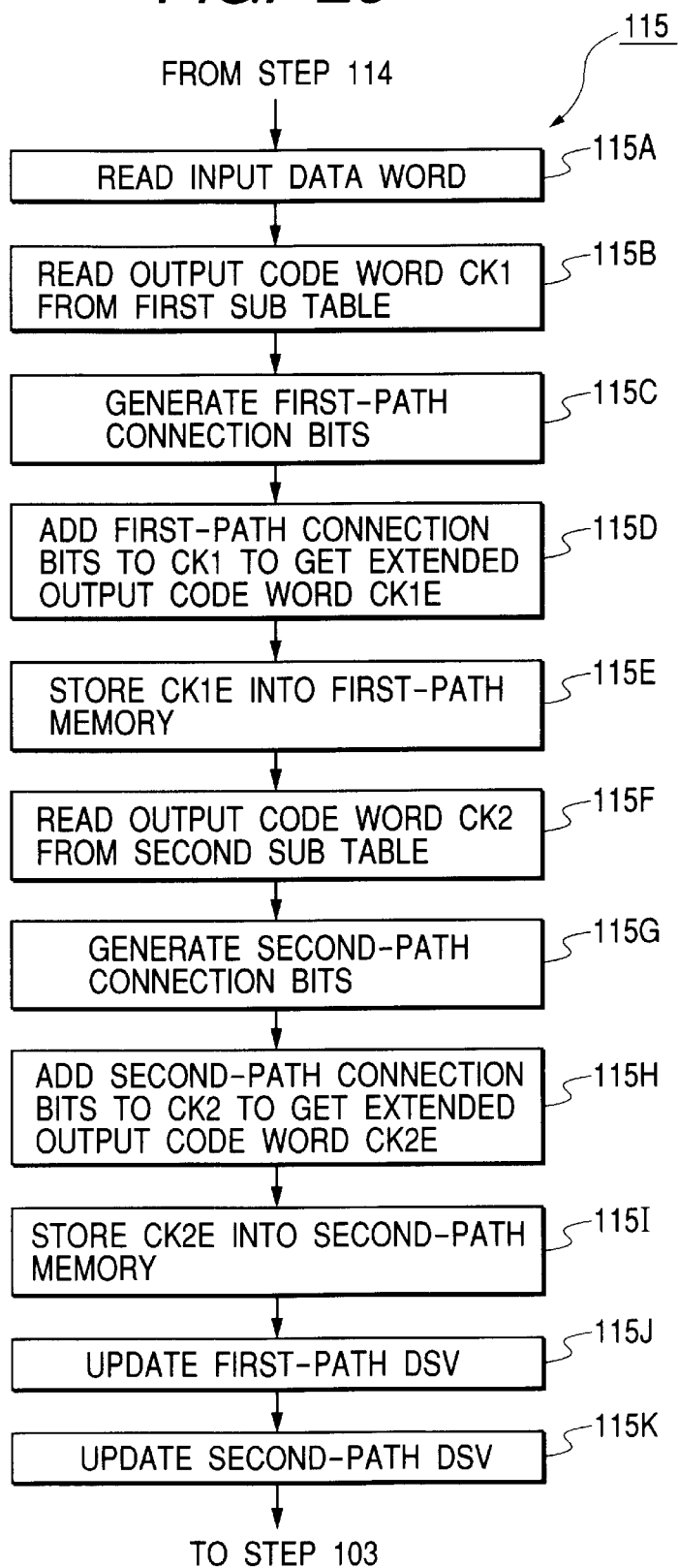
FIG. 20 is a flowchart of a block in FIG. 19.

As shown in FIG. 20, the block 115 includes steps 115A, 115B, 115C, 115D, 115E, 115F, 115G, 115H, 115I, 115J, and 115K which are sequentially arranged in that order. The step 115A follows the step 114 (see FIG. 19). The step 115A receives a next input data word Dk.

The step 115B reads out an output code word Ck1 assigned to the received input data word Dk from the first substitution encoding table 1 having an ID number equal to the state-information number Sk.

The step 115C generates first-path connection bits in response to the received input data word Dk. The bit number "r" of the first-path connection bits is equal to, for example, 2.

The step 115D connects the first-path connection bits to the end of the read-out output code word Ck1 to form an extended output code word Ck1E.

The step 115E stores the extended output code word Ck1E into the path memory 13 as a candidate current output code word OC1k. The output code word OC1k in the memory 13 is denoted by "OC1k−1".

The step 115F reads out an output code word Ck2 assigned to the received input data word Dk from the second substitution encoding table 2 having an ID number equal to the state-information number Sk.

The step 115G generates second-path connection bits in response to the received input data word Dk. The bit number "r" of the second-path connection bits is equal to, for example, 2.

The step 115H connects the second-path connection bits to the end of the read-out output code word Ck2 to form an extended output code word Ck2E.

The step 115I stores the extended output code word Ck2E into the path memory 14 as a candidate current output code word OC2k. The output code word OC2k in the memory 14 is denoted by "OC2k−1".

The step 115J updates the value DSV1 in response to the newest output code word in the path memory 13.

The step 115K updates the value DSV2 in response to the newest output code word in the path memory 14. After the step 115K, the program returns to the step 103 (see FIG. 19).

The program segment in FIGS. 19 and 20 may be modified as follows. According to the modified version of the program segment, the steps 108, 112, and 114 do not transfer output code words from the path memories 13 and 14 to the NRZI conversion circuit 30. In this case, a signal-outputting segment of the control program is started after all the input data words have been processed by the program segment in FIGS. 19 and 20. The signal-outputting segment of the control program serially transfers all the output code words from the path memory 13 or the path memory 14 to the NRZI conversion circuit 30 as finally-selected output code words. According to the modified version of the program segment, when the absolute value |DSV1| is equal to or smaller than the absolute value |DSV2|, the contents of the output code words OC2k−1, OC2k−2, . . . , OC2Tdsv in the path memory 14 are replaced with the contents of the output code words OC1k−1, OC1k−2, . . . , OC1Tdsv in the path memory 13. On the other hand, when the absolute value |DSV1| is greater than the absolute value |DSV2|, the contents of the output code words OC1k−1, OC1k−2, . . . , OC1Tdsv in the path memory 13 are replaced with the contents of the output code words OC2k−1, OC2k−2, . . . , OC2Tdsv in the path memory 14.

Figures 21, 22:
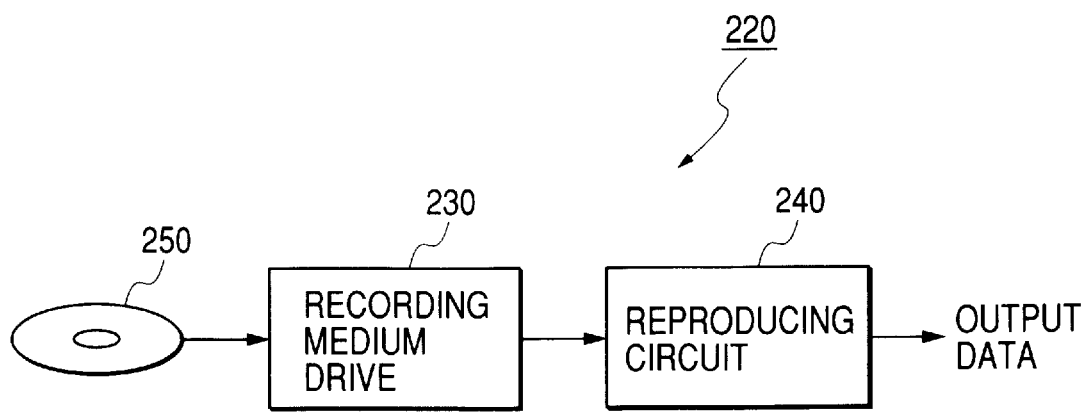
FIG. 21 is a diagram of the relation among connection bits, an input data word assigned to the first substitution encoding tables, and an input data word assigned to the second substitution encoding tables.
FIG. 22 is a block diagram of an information reproducing apparatus according to a second embodiment of this invention.

As shown in FIG. 21, the first-path connection bits and the second-path connection bits depend on the received input data word Dk. The first-path connection bits are "01" when the received input data word Dk is in the range of "0" to "51". The first-path connection bits are "10" when the received input data word Dk is in the range of "52" to "108". The first-path connection bits are "00" when the received input data word Dk is in the range of "109" to "255". The second-path connection bits are "1" when the received input data word Dk is in the range of "0" to "51". The second-path connection bits are "10" when the received input data word Dk is in the range of "52" to "105". The second-path connection bits are "00" when the received input data word Dk is in the range of "106" to "255".

As previously mentioned, the first substitution encoding tables 1 in FIGS. 9–13 and the second substitution encoding tables in FIGS. 14–18 are equal in the assignment of input data words Dk to next-table selection numbers (state-information numbers) Sk+1. Output code words Ck except ones assigned to input data words Dk of "106" to "108" in the first substitution encoding tables 1 are opposite in NRZI-conversion-result DSV parity (DSV polarity) to those in the second substitution encoding tables 2.

As understood from FIG. 21, regarding the first substitution encoding tables 1, first-path connection bits of "01" are connected to the ends of output code words Ck assigned to input data words Dk of "0" to "51" to form extended output code words. First-path connection bits of "10" are connected to the ends of output code words Ck assigned to input data words Dk of "52" to "108" to form extended output code words. First-path connection bits of "00" are connected to the ends of output code words Ck assigned to input data words Dk of "109" to "255" to form extended output code words. Regarding the second substitution encoding tables 2, second-path connection bits of "01" are connected to the ends of output code words Ck assigned to input data words Dk of "0" to "51" to form extended output code words. Second-path connection bits of "10" are connected to the ends of output code words Ck assigned to input data words Dk of "52" to "105" to form extended output code words. Second-path connection bits of "00" are connected to the ends of output code words Ck assigned to input data words Dk of "106" to "255" to form extended output code words. Thus, output code words Ck assigned to input data words Dk of "106" to "108" in the first substitution encoding tables 1 are followed by first-path connection bits of "10" while those in the second substitution encoding tables 2 are followed by second-path connection bits of "00". Therefore, extended output code words corresponding to input data words Dk of "106" to "108" in connection with the first substitution encoding tables 1 are opposite in DSV parity or DSV polarity to those in connection with the second substitution encoding tables 2. Also, extended output code words corresponding to other input data words Dk in connection with the first substitution encoding tables 1 are opposite in DSV parity or DSV polarity to those in connection with the second substitution encoding tables 2.

The first-path connection bits and the second-path connection bits, and the connection of them to output code words to form extended output code words are designed so that the code-word sequence outputted from the modulating section 20 will observe the prescribed RLL constraints.

As previously mentioned, for a same input data word Dk, an extended output code word relating to a first substitution encoding table 1 is opposite in DSV parity or DSV polarity to that relating to a second substitution encoding table 2. Therefore, DSV control can be implemented as a result of the encoding of an input data word by referring to the substitution encoding tables 1 and 2.

It should be noted that the contents of the substitution encoding tables 1 and 2 may be changed from those in FIGS. 9–18 to others which cause the prescribed RLL constraints to be observed in the code-word sequence outputted from the modulating section 20. In this case, it is preferable to suitably alter the way of generating connection bits.

Figure 4:
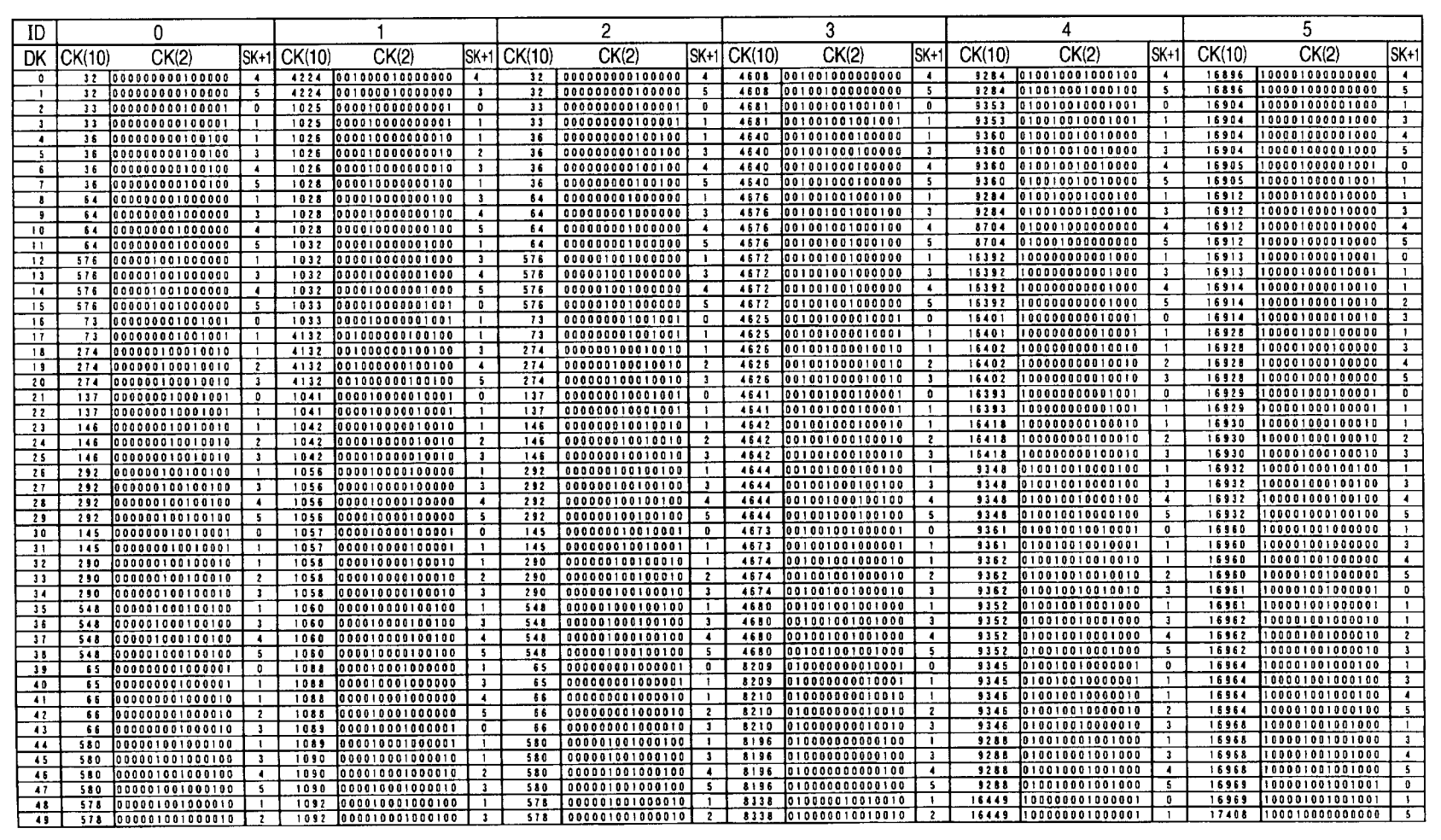

The encoding of an input data word Dk by referring to the main encoding tables 3 will be further explained below. In the case where the predetermined condition "1" for the execution of DSV control is satisfied while the state-information number Sk is "0", when the input data word Dk is in the range of "0" to "38", not only the main encoding table 3 having an ID number of "0" but also the main encoding table 3 having an ID number of "3" are accessed. In this case, different output code words corresponding to the input data word Dk are read out from the accessed main encoding tables 3, and the output code word read out from the main encoding table 3 having an ID number of "0" can be replaced with the output code word read out from the main encoding table 3 having an ID number of "3". FIG. 4 shows that the output code word Ck corresponding to an input data word Dk of "0" and a state-information number Sk of "0" is "000000000100000", and that the output code word Ck corresponding to an input data word Dk of "0" and a state-information number Sk of "3" is "001001000000000". The output code word Ck corresponding to Dk=0 and Sk=0 can be replaced with the output code word Ck corresponding to Dk=0 and Sk=3. FIG. 4 shows that both the next-table selection number Sk+1 accompanying the output code word Ck corresponding to Dk=0 and Sk=0 and the next-table selection number Sk+1 accompanying the output code word Ck corresponding to Dk=0 and Sk=3 are equal to "4".

The total number of bits of "1" in the above-indicated output code word Ck "000000000100000" is odd. Thus, the total number of level change points in the result of the two-level or ±1-level NRZI conversion of "000000000100000" is odd. Accordingly, in the case where the result of the NRZI conversion of the immediately-preceding output code word ends at a recording level of −1, a level inversion to +1 is caused by the NRZI conversion of the output code word Ck "000000000100000" as viewed at the conversion-result end point. On the other hand, the total number of bits of "1" in the previously-indicated output code word Ck "001001000000000" is even. Thus, in the case where the result of the NRZI conversion of the immediately-preceding output code word ends at a recording level of −1, the recording level remains −1 and a level inversion does not occur regarding the NRZI conversion of the output code word Ck "001001000000000" as viewed at the conversion-result end point. Therefore, the polarity of an actually-recoded signal (an NRZI-conversion-resultant signal) can be changed according to "odd-even" in the number of bits of "1" in an output code word. As previously mentioned, the output code word Ck "000000000100000" and the output code word Ck "001001000000000" are accompanied with the same next-table selection number (the state-information number) Sk+1. Therefore, the polarity of the DSV value, which results from summing the levels of an actually-recorded signal, can be inverted according to the replacement of the output code word Ck "000000000100000" by the output code word Ck "001001000000000" without causing an encoding disorder.

In the case where the predetermined condition "1" for the execution of DSV control is satisfied, the DSV polarity for output code words Ck assigned to other input data words Dk can also be inverted. Furthermore, in the case where the predetermined condition "2" or "3" is satisfied, the DSV polarity can also be inverted.

The predetermined condition "1" for the execution of DSV control relates to the main encoding tables 3 having ID numbers of "0" and "3". In all the main encoding tables 3, each output code word Ck accompanied with a next-table selection number Sk+1 of "0" ends at a bit of "1". The zero run length of the MSB side of each of output code words Ck assigned to input data words Dk of "0" to "38" in the main encoding table 3 having an ID number of "3" is equal to "2". In other words, three former bits of each of output code words Ck assigned to input data words Dk of "0" to "38" in the main encoding table 3 having an ID number of "3" are "0", "0", and "1", respectively. Thus, even in the case where output code words Ck assigned to input data words Dk of "0" to "38" in the main encoding table 3 having an ID number of "3" are used instead of output code words assigned to input data words Dk of "0" to "38" in the main encoding table 3 having an ID number of "0", the resultant output-code-word sequence follows the prescribed RLL constraints.

The predetermined condition "2" for the execution of DSV control relates to the main encoding tables 3 having ID numbers of "2" and "4". In all the main encoding tables 3, the zero run length of the LSB side of each output code word Ck accompanied with a next-table selection number Sk+1 of "2" is equal to "1". In other words, two end bits of each output code word Ck accompanied with a next-table selection number Sk+1 of "2" are "1" and "0", respectively. The zero run length of the MSB side of each of output code words Ck assigned to input data words Dk of "0" to "11" and "26" to "47" in the main encoding table 3 having an ID number of "4" is equal to "1". In other words, two former bits of each of output code words Ck assigned to input data words Dk of "0" to "11" and "26" to "47" in the main encoding table 3 having an ID number of "4" are "0" and "1", respectively. Thus, even in the case where output code words Ck assigned to input data words Dk of "0" to "11" and "26" to "47" in the main encoding table 3 having an ID number of "4" are used instead of output code words assigned to input data words Dk of "0" to "11" and "26" to "47" in the main encoding table 3 having an ID number of "2", the resultant output-code-word sequence follows the prescribed RLL constraints.

Regarding the predetermined condition "3" for the execution of DSV control, a decision is made as to whether or not the prescribed RLL constraints will keep satisfied as a result of the replacement of an output code word Ck with another. The output-code-word replacement is permitted when the decision result indicates that the resultant output-code-word sequence will follow the prescribed RLL constraints.

An explanation will be given of operation of the modulating section 20 which occurs in the following conditions. The state-information number Sk starts from an initial value being "0". There is a sequence of input data words Dk as "0", "1", "2", "3", and "4". The fourth input data word Dk, that is, the input data word being "3", is modulated by referring to one of the substitution encoding tables 1 and 2. The other input data words Dk are modulated by referring to the main encoding tables 3. At an initial stage, the state-information number Sk is "0" so that the main encoding table 3 having an ID number of "0" is accessed for the first input data word Dk being "0". An output code word Ck of "000000000100000" which is assigned to an input data word Dk of "0" is read out from the accessed main encoding table 3 (see FIG. 4). Accordingly, the first input data word Dk being "0" is encoded into an output code word Ck of "000000000100000". The output code word Ck being "000000000100000" is accompanied with a next-table selection number Sk+1 of "4". Thus, the state-information number Sk is updated to "4". Since the state-information number Sk is "4", the main encoding table 3 having an ID number of "4" is accessed for the second input data word Dk being "1". An output code word Ck of "010010001000100" which is assigned to an input data word Dk of "1" is read out from the accessed main encoding table 3 (see FIG. 4). Accordingly, the second input data word Dk being "1" is encoded into an output code word Ck of "010010001000100". The output code word Ck being "010010001000100" is accompanied with a next-table selection number Sk+1 of "5". Thus, the state-information number Sk is updated to "5". Since the state-information number Sk is "5", the main encoding table 3 having an ID number of "5" is accessed for the third input data word Dk being "2". An output code word Ck of "100001000001000" which is assigned to an input data word Dk of "2" is read out from the accessed main encoding table 3 (see FIG. 4). Accordingly, the third input data word Dk being "2" is encoded into an output code word Ck of "100001000001000". The output code word Ck being "100001000001000" is accompanied with a next-table selection number Sk+1 of "1". Thus, the state-information number Sk is updated to "1". Since the state-information number Sk is "1", the first substitution encoding table 1 or the second substitution encoding table 3 having an ID number of "1" is finally used for conversion of the fourth input data word Dk being "3". When the first substitution encoding table 1 having an ID number of "1" is finally used, an output code word Ck of "000010000100010" which is assigned to an input data word Dk of "3" is read out therefrom (see FIG. 9). The output code word Ck being "000010000100010" is accompanied with a next-table selection number Sk+1 of "1". Thus, the state-information number Sk remains "1". The output code word Ck being "000010000100010" is followed by connection bits of "01" (see FIG. 21). Accordingly, the output code word Ck is extended to "00001000010001001". As a result, the fourth input data word Dk being "3" is encoded into an output code word Ck of "00001000010001001". On the other hand, when the second substitution encoding table 2 having an ID number of "1" is finally used, an output code word Ck of "000010000000100" which is assigned to an input data word Dk of "3" is read out therefrom (see FIG. 14). The output code word Ck being "000010000000100" is accompanied with a next-table selection number Sk+1 of "1". Thus, the state-information number Sk remains "1". The output code word Ck being "000010000000100" is followed by connection bits of "01" (see FIG. 21). Accordingly, the output code word Ck is extended to "00001000000010001". As a result, the fourth input data word Dk being "3" is encoded into an output code word Ck of "00001000000010001". Since the state-information number Sk is "1", the main encoding table 3 having an ID number of "1" is accessed for the fifth input data word Dk being "4". An output code word Ck of "000010000000010" which is assigned to an input data word Dk of "4" is read out from the accessed main encoding table 3 (see FIG. 4). Accordingly, the fifth input data word Dk being "4" is encoded into an output code word Ck of "000010000000010". The output code word Ck being "000010000000010" is accompanied with a next-table selection number Sk+1 of "1". Thus, the state-information number Sk remains "1".

The summary of DSV control is as follows. The output signal from the code-word-selection detector 11 selectively indicates the presence and the absence of a word selection. Also, the output signal from the word counter 12 selectively indicates the presence and the absence of a word selection. In the presence of a word selection, two different candidate output code words are stored into the path memories 13 and 14 respectively. In the absence of a word selection, a same output code word is stored into both the path memories 13 and 14. A time interval from the moment of the presence of a word selection to the moment of the presence of a next word selection is defined as one DSV control term. A DSV control step is executed once for every DSV control term. The beginning of every DSV control term is caused by a word selection. Thus, at the beginning of a DSV control term, two different candidate output code words are stored into the path memories 13 and 14 respectively. The two candidate output code words provide different DSV-related polarities, respectively. During a subsequent portion of the DSV control term, a same output code word is stored into both the path memories 13 and 14, and this processing is iterated. As a result, a succession of output code words starting from candidate one is in the path memory 13. Similarly, a succession of output code words starting from candidate one is in the path memory 14. The succession of output code words except candidate one in the path memory 13 is identical with that in the path memory 14. Each time different candidate output code words or a same output code word has been written into the path memories 13 and 14, a first DSV is updated in response to the written output code word in the path memory 13 and also a second DSV is updated in response to the written output code word in the path memory 14. At an end of the DSV control term which is followed by the moment of a next word selection, the absolute value of the first DSV and the absolute value of the second DSV are compared with each other. When the comparison result indicates that the absolute value of the first DSV is equal to or smaller than the absolute value of the second DSV, the succession of output code words is expelled from the path memory 13 toward the NRZI conversion circuit 30. At the same time, the path memory 14 is cleared, and the second DSV is updated to the first DSV. When the comparison result indicates that the absolute value of the first DSV is greater than the absolute value of the second DSV, the succession of output code words is expelled from the path memory 14 toward the NRZI conversion circuit 30. At the same time, the path memory 13 is cleared, and the first DSV is updated to the second DSV.

Second Embodiment

FIG. 22 shows an information reproducing apparatus 220 which basically operates to reproduce digital information from a recording medium 250. The digital information has been recorded on the recording medium 250 by, for example, the information recording apparatus 100 of FIG. 1. The recording medium 250 includes, for example, an optical disc.

The information reproducing apparatus 220 includes a recording-medium drive circuit 230 and a reproducing circuit 240. The recording-medium drive circuit 230 is followed by the reproducing circuit 240. The recording-medium drive circuit 230 can access the recording medium 250. The recording-medium drive circuit 230 reads out a signal representative of the digital information from the recording medium 250, and feeds the read-out signal to the reproducing circuit 240. The reproducing circuit 240 demodulates the read-out signal into original data words. The reproducing circuit 240 outputs the resultant data words.

Figure 23:
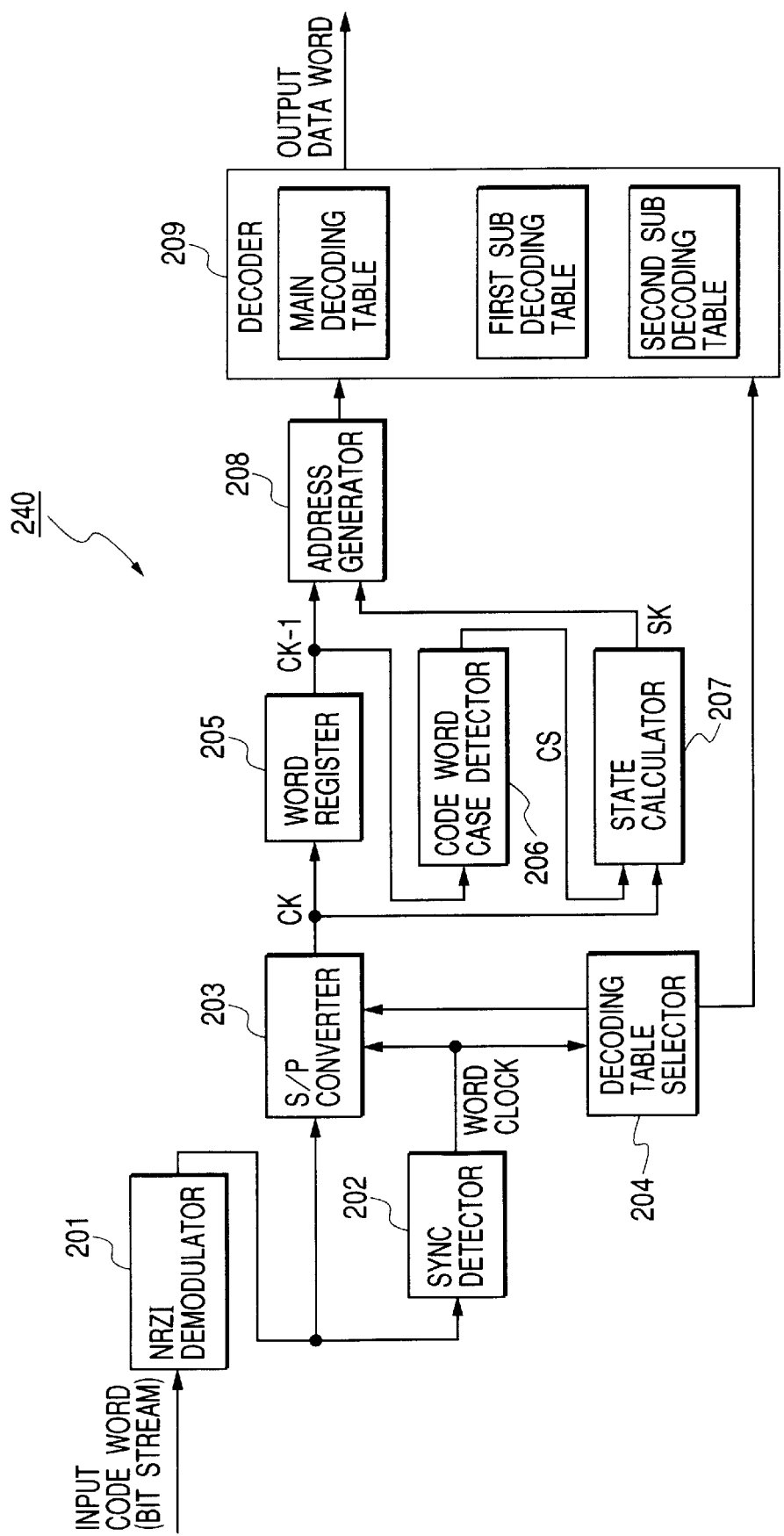
FIG. 23 is a block diagram of a reproducing circuit in FIG. 22.

As shown in FIG. 23, the reproducing circuit 240 includes an NRZI demodulator 201, a sync detector 202, a serial-to-parallel (S/P) converter 203, a decoding-table selector 204, a word register 205, a code-word case detector 206, a state calculator 207, an address generator 208, and a decoder 209. The NRZI demodulator 201 follows the recording-medium drive circuit 230 (see FIG. 22). The NRZI demodulator 201 is connected with the sync detector 202 and the S/P converter 203. The sync detector 202 is connected with the S/P converter 203 and the decoding-table selector 204. The S/P converter 203 is connected with the decoding-table selector 204, the word register 205, and the state calculator 207. The decoding-table selector 204 is connected with the decoder 209. The word register 205 is connected with the code-word case detector 206 and the address generator 208. The code-word case detector 206 is connected with the state calculator 207. The state calculator 207 is connected with the address generator 208. The address generator 208 is connected with the decoder 209. The devices 202–209 which follow the NRZI demodulator 201 compose a demodulating section.

The NRZI demodulator 201 receives the output digital signal of the recording-medium drive circuit 230 (see FIG. 22), and subjects the received digital signal to NRZI demodulation or NRZI conversion. The NRZI demodulator 201 outputs the NRZI-demodulation-resultant signal (the NRZI-demodulation-resultant bit stream) to the sync detector 202 and the S/P converter 203.

The sync detector 202 detects every sync bit pattern (a sync signal) in the NRZI-demodulation-resultant signal. The sync detector 202 generates a word clock signal in response to the detected sync bit patterns. The sync detector 202 feeds the generated word clock signal to the S/P converter 203 and the decoding-table selector 204. The decoding-table selector 204 generates a control signal in response to the word clock signal. The generated control signal indicates whether a current portion of the NRZI-demodulation-resultant signal originates from the encoding by use of one of the main encoding tables 3 (see FIGS. 1 and 2) or the encoding by use of one of the substitution encoding tables 1 and 2. The decoding-table selector 204 feeds the control signal to the S/P converter 203 and the decoder 209.

The S/P converter 203 subjects the NRZI-demodulation-resultant bit stream to serial-to-parallel conversion in response to the word clock signal and the control signal, thereby changing the NRZI-demodulation-resultant bit stream into a sequence of parallel-form input code words Ck including normal-length code words and extended code words ending at connection bits. The S/P converter 203 sequentially sends input code words Ck to the next stage. The S/P converter 203 feeds a current input code word Ck to the word register 205 and the state calculator 207. The input code word Ck is written into the word register 205. The input code word Ck is temporarily stored in the word register 205 before being outputted therefrom as a delayed input code word Ck−1. Specifically, the word register 205 delays the input code word by a time interval corresponding to one word. The delayed input code word Ck−1 is fed from the word register 205 to the code-word case detector 206 and the address generator 208.

The code-word case detector 206 detects a code-word-related case CS in response to the delayed input code word Ck−1. The code-word case detector 206 notifies the state calculator 207 of the detected case CS. The state calculator 207 computes an encoding state Sk from the input code word Ck and the detected case CS. The computed encoding state Sk corresponds to the encoding table (one of the encoding tables 1, 2, and 3) used in generating the input code word Ck. In other words, the computed encoding state Sk is identical to the next-table selection number (the information-state number) Sk+1 accompanying the delayed input code word Ck−1 and used in an encoder side. Thus, the next-table selection number Sk+1 accompanying the delayed input code word Ck−1 is recovered. The state calculator 207 notifies the address generator 208 of the encoding state Sk (the next-table selection number Sk+1 accompanying the delayed input code word Ck−1).

The address generator 208 produces an address signal in response to the delayed input code word Ck−1 and the encoding state Sk. The address generator 208 outputs the produced address signal to the decoder 209. The decoder 209 contains a main decoding table for normal-length input code words, and first and second substitution decoding tables for extended input code words ending at connection bits. The main decoding table has an array of output data words (for example, 8-bit output data words) at different addresses. Similarly, each of the first and second substitution decoding tables has an array of output data words (for example, 8-bit output data words) at different addresses. The main decoding table or the first and second substitution decoding tables are selected in response to the control signal fed from the decoding-table selector 204. When the first and second substitution decoding tables are selected, one is finally selected from the two. The selected decoding table (the main decoding table or the finally-selected substitution decoding table) is accessed in response to the address signal. One output data word Dk−1 at an address corresponding to the address signal is selected from the output data words in the accessed decoding table. The decoder 209 feeds the selected output data word Dk−1 to an external device or an external line.

Specifically, the main decoding table includes an array of cells each having a set of an input code word Ck−1, an output data word Dk−1, and an encoding state Sk (a next-table selection number Sk+1 accompanying the input code word Ck−1). The input code word Ck−1 and the encoding state Sk in each cell are used as an indication of an address. Similarly, the first substitution decoding table includes an array of cells each having a set of an input code word Ck−1, an output data word Dk−1, and an encoding state Sk (a next-table selection number Sk+1 accompanying the input code word Ck−1). The input code word Ck−1 and the encoding state Sk in each cell are used as an indication of an address. Also, the second substitution decoding table includes an array of cells each having a set of an input code word Ck−1, an output data word Dk−1, and an encoding state Sk (a next-table selection number Sk+1 accompanying the input code word Ck−1). The input code word Ck−1 and the encoding state Sk in each cell are used as an indication of an address. Thus, an output data word Dk−1 can be decided in response to a set of an input code word Ck−1 and an encoding state Sk by referring to the selected decoding table (one among the main decoding table and the first and second substitution decoding tables).

Input code words can be grouped into five cases "0", "1", "2", "3", and "4" according to LSB-side zero run length. FIG. 24 shows the relation among the cases "0", "1", "2", "3", and "4", the LSB-side zero run lengths, and the next-code-word states corresponding to the encoding-table ID numbers or the state-information numbers Sk.

With reference to FIG. 24, input code words each having an LSB-side zero run length of "0" are assigned to the case "0". Input code words each having an LSB-side zero run length of "1" are assigned to the case "1". Input code words having LSB-side zero run lengths of "2" to "6" are assigned to the case "2". Input code words each having an LSB-side zero run length of "7" or "8" are assigned to the case "3". Input code words each having an LSB-side zero run length of "9" are assigned to the case "4". Each of the input code words in the case "0" is always followed by an input code word resulting from an encoding procedure which uses an encoding table having an ID number of "0" or "1", that is, an encoding table corresponding to a state-information number of "0" or "1". Each of the input code words in the case "1" is always followed by an input code word resulting from an encoding procedure which uses an encoding table having an ID number of "1", "2", or "3", that is, an encoding table corresponding to a state-information number of "1", "2", or "3". Each of the input code words in the case "2" is always followed by an input code word resulting from an encoding procedure which uses an encoding table having an ID number of "1", "3", "4", or "5", that is, an encoding table corresponding to a state-information number of "1", "3", "4", or "5". Each of the input code words in the case "3" is always followed by an input code word resulting from an encoding procedure which uses an encoding table having an ID number of "3", "4", or "5", that is, an encoding table corresponding to a state-information number of "3", "4", or "5". Each of the input code words in the case "4" is always followed by an input code word resulting from an encoding procedure which uses an encoding table having an ID number of "4" or "5", that is, an encoding table corresponding to a state-information number of "4" or "5".

The code-word case detector 206 in FIG. 23 contains a table representative of the previously-mentioned assignment of the input code words to the cases "0", "1", "2", "3", and "4" which depends on LSB-side zero run length. The code-word case detector 206 detects the LSB-side zero run length of the delayed input code word Ck−1. The code-word case detector 206 accesses the assignment table in response to the detected zero run length, and thereby detects the case CS to which the delayed input code word Ck−1 is assigned.

The code-word case detector 206 notifies the state calculator 207 of the detected case CS. The state calculator 207 computes an encoding state Sk from the input code word Ck and the detected case CS according to a predetermined algorithm. An example of the predetermined algorithm in a C-language-based version is shown in FIG. 26. The computed encoding state Sk corresponds to the encoding table used in generating the input code word Ck. In other words, the computed encoding state Sk is identical to the next-table selection number Sk+1 accompanying the delayed input code word Ck−1. The state calculator 207 notifies the encoding state Sk (the next-table selection number Sk+1 accompanying the delayed input code word Ck−1) to the address generator 208.

The address generator 208 produces an address signal in response to the delayed input code word Ck−1 and the encoding state Sk. For example, the address generator 208 combines the delayed input code word Ck−1 and the encoding state Sk into an address signal. The address generator 208 outputs the produced address signal to the decoder 209. The address signal contains the delayed input code word Ck−1. The decoder 209 selects the main decoding table or the first and second substitution decoding tables in response to the control signal fed from the decoding-table selector 204. When the first and second substitution decoding tables are selected, the decoder 209 counts bits of "1" in the delayed input code word Ck−1. Then, the decoder 209 decides whether the number of bits of "1" in the delayed input code word Ck−1 is odd or even. The decoder 209 finally selects one from the first and second substitution decoding tables in response to the odd-even decision result and the delayed input code word Ck−1. The decoder 209 accesses the selected decoding table (the main decoding table or the finally-selected substitution decoding table) in response to the address signal. An output data word Dk−1 corresponding to the address signal, that is, an output data word Dk−1 corresponding to a set of the delayed input code word Ck−1 and the encoding state Sk, is read out from the accessed decoding table. The decoder 209 feeds the read-out output data word Dk−1 to an external device or an external line.

The reproducing circuit 240 in FIG. 23 may be at least partially formed by a digital signal processor, a CPU, or a similar device including a combination of an input/output port, a processing portion, a ROM, and a RAM. In this case, the related part of the reproducing circuit 240 operates in accordance with a control program stored in the ROM or the RAM. The control program contains the predetermined algorithm for calculating the encoding state Sk. The main decoding table, the first and second substitution decoding tables, and the assignment table are provided in the ROM or the RAM.

Figure 25:
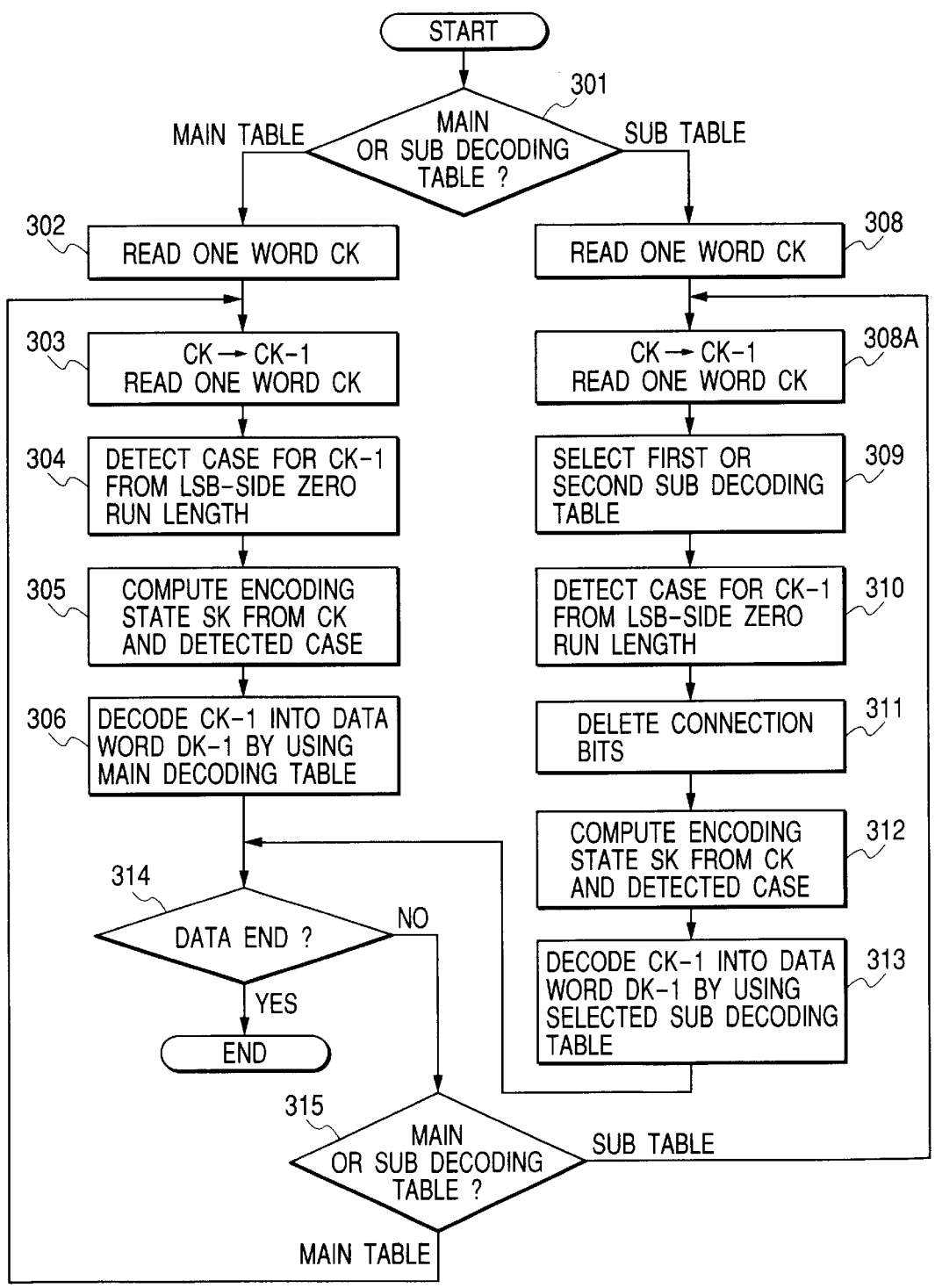
FIG. 25 is a flowchart of a segment of a control program for the reproducing circuit in FIG. 22.

FIG. 25 is a flowchart of a segment of the control program for the reproducing circuit 240. The program segment in FIG. 25 is designed to process the output signal from the S/P converter 203 in response to the control signal fed from the decoding-table selector 204. As shown in FIG. 25, a first step 301 of the program segment refers to the control signal fed from the decoding-table selector 204, and thereby decides whether the main decoding table or one of the first and second substitution decoding tables should be currently used. When it is decided that the main decoding table should be used, the program advances from the step 301 to a step 302. On the other hand, when it is decided that one of the first and second substitution decoding tables should be used, the program advances from the step 301 to a step 308.

The step 302 receives a current input code word Ck from the S/P converter 203. After the step 302, the program advances to a step 303.

The step 303 stores the current input code word Ck into the RAM for later use as an input code word Ck−1 of interest (a delayed input code word or an input code word Ck−1 immediately preceding the current input code word Ck). In addition, the step 303 receives a next input code word Ck from the S/P converter 203.

A step 304 following the step 303 retrieves an input code word Ck−1 of interest from the RAM. The step 304 detects the LSB-side zero run length of the input code word Ck−1 of interest. The step 304 accesses the assignment table in response to the detected zero run length, and thereby detects the case CS to which the input code word Ck−1 of interest is assigned.

A step 305 subsequent to the step 304 computes an encoding state Sk from the current input code word Ck (the input code word immediately following the input code word Ck−1 of interest) and the detected case CS according to the predetermined algorithm. The computed encoding state Sk is equal to the next-table selection number Sk+1 accompanying the input code word Ck−1 of interest.

A step 306 following the step 305 generates an address signal in response to the input code word Ck−1 of interest and the encoding state Sk. The step 306 accesses the main decoding table in response to the address signal to get an output data word Dk−1 assigned to the input code word Ck−1 of interest. After the step 306, the program advances to a step 314.

The step 308 receives a current input code word Ck from the S/P converter 203. After the step 308, the program advances to a step 308A.

The step 308A stores the current input code word Ck into the RAM for later use as an input code word Ck−1 of interest (a delayed input code word or an input code word Ck−1 immediately preceding the current input code word Ck). In addition, the step 308A receives a next input code word Ck from the S/P converter 203.

A step 309 following the step 308A retrieves an input code word Ck−1 of interest from the RAM. The step 309 calculates the number of bits of "1" in the input code word Ck−1 of interest. The step 309 decides whether the calculated number of bits of "1" is odd or even. The step 309 selects one from the first and second substitution decoding tables in response to the odd-even decision result and the input code word Ck−1.

A step 310 subsequent to the step 309 detects the LSB-side zero run length of the input code word Ck−1 of interest (preferably, except connection bits). The step 310 accesses the assignment table in response to the detected zero run length, and thereby detects the case CS to which the input code word Ck−1 of interest is assigned.

A step 311 following the step 310 deletes connection bits from the input code word Ck−1 of interest to get a normal-length input code word Ck−1 of interest.

A step 312 subsequent to the step 311 computes an encoding state Sk from the current input code word Ck (the input code word immediately following the input code word Ck−1 of interest) and the detected case CS according to the predetermined algorithm. The computed encoding state Sk is equal to the next-table selection number Sk+1 accompanying the normal-length input code word Ck−1 of interest.

A step 313 following the step 312 generates an address signal in response to the normal-length input code word Ck−1 of interest and the encoding state Sk. The step 313 accesses the substitution decoding table, which is selected by the step 309, in response to the address signal to get an output data word Dk−1 assigned to the normal-length input code word Ck−1 of interest. After the step 313, the program advances to the step 314.

The step 314 decides whether or not the current input code word Ck−1 corresponds to an end of the effective output signal from the S/P converter 203. When the current input code word Ck−1 corresponds to an end, the program exits from the step 314 and then the current execution cycle of the program segment ends. Otherwise, the program advances from the step 314 to a step 315.

The step 315 refers to the control signal fed from the decoding-table selector 204, and thereby decides whether the main decoding table or one of the first and second substitution decoding tables should be currently used. When it is decided that the main decoding table should be used, the program returns from the step 315 to the step 303. On the other hand, when it is decided that one of the first and second substitution decoding tables should be used, the program returns from the step 315 to the step 308A.

An explanation will be given of operation of the reproducing circuit 240 which occurs in the following conditions. There is a sequence of input code words Ck as "000000000100000", "010010001000100", "10000100001000", "00001000010001001", and "000010000000010". The fourth input code word Ck, that is, the input code word being "00001000010001001", results from an encoding procedure using one of the first and second substitution encoding tables 1 and 2. The other input code words Ck result from encoding procedures using the main encoding tables 3. Since the LSB-side zero run length of the first input code word Ck being "000000000100000" is "5", the case CS to which the first input code word Ck is assigned is found to be the case "2" by referring to the previously-mentioned assignment table (see FIG. 24). The encoding state Sk is found to be "4" according to the predetermined algorithm using the case "2" and the second input code word Ck being "010010001000100". The first input code word Ck is decoded into an output data word Dk of "0" by referring to the main decoding table in response to the contents of the first input code word Ck and the encoding state Sk being "4". Since the LSB-side zero run length of the second input code word Ck being "010010001000100" is "2", the case CS to which the second input code word Ck is assigned is found to be the case "2" by referring to the previously-mentioned assignment table (see FIG. 24). The encoding state Sk is found to be "5" according to the predetermined algorithm using the case "2" and the third input code word Ck being "100001000001000". The second input code word Ck is decoded into an output data word Dk of "1" by referring to the main decoding table in response to the contents of the second input code word Ck and the encoding state Sk being "5". Since the LSB-side zero run length of the third input code word Ck being "100001000001000" is "3", the case CS to which the third input code word Ck is assigned is found to be the case "2" by referring to the previously-mentioned assignment table (see FIG. 24). The encoding state Sk is found to be "1" according to the predetermined algorithm using the case "2" and the 15 higher bits of the fourth input code word Ck being "00001000010001001". The third input code word Ck is decoded into an output data word Dk of "2" by referring to the main decoding table in response to the contents of the third input code word Ck and the encoding state Sk being "1". Connection bits are deleted from the fourth input code word Ck being "00001000010001001" so that the fourth input code word Ck is shortened to "000010000100010". Since the LSB-side zero run length of the fourth input code word Ck being "000010000100010" is "1", the case CS to which the fourth input code word Ck is assigned is found to be the case "1" by referring to the previously-mentioned assignment table (see FIG. 24). The encoding state Sk is found to be "1" according to the predetermined algorithm using the case "1" and the fifth input code word Ck being "000010000000010". A decision is made as to whether the number of bits of "1" in the fourth input code word Ck is odd or even. One is selected from the first and second substitution decoding tables in response to the decision result. The fourth input code word Ck is decoded into an output data word of "3" by referring to the selected substitution decoding table in response to the contents of the fourth input code word Ck and the encoding state Sk being "1".

Advantages Provided by the Invention

According to this invention, not only the size of the main encoding tables 3 but also the size of the substitution encoding tables 1 and 2 correspond to 15 bits for each output code word assigned to an 8-bit data word. Therefore, the size of the substitution encoding tables 1 and 2 is smaller than that of prior-art EFMCC substitution encoding tables which correspond to 17 bits for each output code word.

In this invention, "p"-bit data words are encoded into "q"-bit code words, where "p" and "q" denote predetermined natural numbers respectively. The main encoding tables 3, the first substitution encoding tables 1, and the second substitution encoding tables 2 are utilized in the encoding of "p"-bit data words into "q"-bit code words. Connection bits, the number of which is equal to a predetermined value "r", are added to each "q"-bit code word originating from one of the first and second substitution encoding tables 1 and 2. Thus, each "q"-bit code word originating from one of the first and second substitution encoding tables 1 and 2 is extended into a "q+r"-bit code word. In this invention, "q"-bit code words originating from the main encoding tables 3, and "q+r"-bit code words whose "q"-bit portions originate from the substitution encoding tables 1 and 2 are sequentially connected in the order of occurrence. As a result, a code-word sequence is generated. The main encoding table 3, the first substitution encoding tables 1, and the second substitution encoding tables 2 are designed so that the code-word sequence will satisfy the prescribed RLL constraints. In addition, output code words Ck except ones assigned to input data words Dk of "106" to "108" in the first substitution encoding tables 1 are opposite in DSV parity (DSV polarity or "odd-even" in the number of bits of "1") to those in the second substitution encoding tables 2. According to this invention, the frequency of the execution of DSV control can be relatively high, and low-frequency components of the code-word sequence can be effectively suppressed.

What is claimed is:

1. A modulation method comprising the steps of:

modulating "p"-bit input data words into "q"-bit output code words by referring to a set of main encoding tables, a set of first substitution encoding tables, and a set of second substitution encoding tables, wherein "p" denotes a first predetermined natural number and "q" denotes a second predetermined natural number greater than the number "p";

wherein the main encoding tables contain output code words assigned to input data words, and contain state information accompanying each output code word, wherein the state information designates an encoding table among the main encoding tables and the first and second substitution encoding tables which is used next to generate an output code word immediately following the output code word accompanied with the state information in a manner such that a resultant succession of the output code words follows prescribed run length limiting rules, and wherein NRZI conversion results of output code words in first specified one of the main encoding tables which are assigned to prescribed input data words are opposite in polarity to NRZI conversion results of output code words in second specified one of the main encoding tables which are assigned to the prescribed input data words;

wherein the first substitution encoding tables contain output code words assigned to input data words, and contain state information accompanying each output code word, wherein the state information designates an encoding table among the main encoding tables and the first and second substitution encoding tables which is used next to generate an output code word immediately following "r" connection bits connected to the output code word accompanied with the state information in a manner such that a resultant succession of the output code words with the connection bits follows the prescribed run length limiting rules, and wherein "r" denotes a third predetermined natural number;

wherein the second substitution encoding tables contain output code words assigned to input data words, and contain state information accompanying each output code word, wherein the state information designates an encoding table among the main encoding tables and the first and second substitution encoding tables which is used next to generate an output code word immediately following "r" connection bits connected to the output code word accompanied with the state information in a manner such that a resultant succession of the output code words with the connection bits follows the prescribed run length limiting rules;

wherein NRZI conversion results of output code words in the first substitution encoding tables which are assigned to input data words are opposite in polarity to NRZI conversion results of output code words in the second substitution encoding tables which are assigned to said input data words, and wherein the first substitution encoding tables are equal to the second substitution encoding tables in assignment of state information to input data words;

periodically selecting the main encoding tables instead of the first and second substitution encoding tables, and using the selected main encoding tables in modulating "p"-bit input data words into "q"-bit output code words;

periodically selecting the first and second substitution encoding tables instead of the main encoding tables, and using the selected first and second substitution encoding tables in modulating "p"-bit input data words into "q"-bit output code words;

generating a final "q"-bit output code word in response to a current input data word different from the prescribed input data words by referring to one of the main encoding tables when the main encoding tables are selected;

generating a first candidate output code word in response to a current input data word equal to one of the prescribed input data words by referring to the first specified one of the main encoding tables when the main encoding tables are selected;

generating a second candidate output code word in response to the current input data word equal to said one of the prescribed input data words by referring to the second specified one of the main encoding tables when the main encoding tables are selected;

calculating a first DSV from a succession of output code words including the first candidate output code word;

calculating a second DSV from a succession of output code words including the second candidate output code word;

determining which of an absolute value of the first DSV and an absolute value of the second DSV is smaller;

selecting one from the first and second candidate output code words which corresponds to the smaller DSV absolute value as a final "q"-bit output code word;

generating a third candidate output code word in response to a current input data word by referring to one of the first substitution encoding tables when the first and second substitution encoding tables are selected;

adding "r" connection bits to the third candidate output code word to get a fourth candidate output code word;

generating a fifth candidate output code word in response to the current input data word by referring to one of the second substitution encoding tables when the first and second substitution encoding tables are selected;

adding "r" connection bits to the fifth candidate output code word to get a sixth candidate output code word;

calculating a third DSV from a succession of output code words including the fourth candidate output code word;

calculating a fourth DSV from a succession of output code words including the sixth candidate output code word;

determining which of an absolute value of the third DSV and an absolute value of the fourth DSV is smaller;

selecting one from the fourth and sixth candidate output code words which corresponds to the smaller DSV absolute value as a final "q+r"-bit output code word; and connecting final "r"-bit output code words and final "q+r"-bit output code words into an output-code-word sequence which follows the prescribed run length limiting rules.

2. A modulation method as recited in claim 1, wherein the numbers "p", "q", and "r" are equal to 8, 15, and 2 respectively, and wherein the prescribed run length limiting rules causes a minimum run length in a result of NRZI conversion of the output-code-word sequence to be equal to 3T, and causes a maximum run length therein to be equal to 14T or less, where T denotes a channel bit period related to the final "r"-bit output code words and the final "q+r"-bit output code words.

3. A method of demodulating a code-word sequence, which is generated by the modulation method of claim 1, into a data-word sequence, the demodulating method comprising the steps of:

detecting whether a current input code word results from modulation using one of the main encoding tables or modulation using one of the first and second substitution encoding tables;

when it is detected that the current input code word results from modulation using one of the main encoding tables, generating first encoding-state information from the current input code word and a next input code word, the first encoding-state information representing which of the main encoding tables has been used in generating the next input code word;

demodulating the current input code word into an original data word by referring to a main decoding table in response to the current input code word and the first encoding-state information;

when it is detected that the current input code word results from modulation using one of the first and second substitution encoding tables, selecting one from first and second substitution decoding tables in response to the current input code word;

when it is detected that the current input code word results from modulation using one of the first and second substitution encoding tables, deleting connection bits from the current input code word to get a normal-length current input code word;

generating second encoding-state information from the normal-length current input code word and a next input code word, the second encoding-state information representing which of the first and second substitution encoding tables has been used in generating the next input code word; and demodulating the normal-length current input code word into an original data word by referring to the selected substitution decoding table in response to the normal-length current input code word and the second encoding-state information.

4. A modulation apparatus comprising:

a set of main encoding tables, a set of first substitution encoding tables, and a set of second substitution encoding tables;

means for modulating "p"-bit input data words into "q"-bit output code words by referring to the main encoding tables and the first and second substitution encoding tables, wherein "p" denotes a first predetermined natural number and "q" denotes a second predetermined natural number greater than the number "p";

wherein the main encoding tables contain output code words assigned to input data words, and contain state information accompanying each output code word, wherein the state information designates an encoding table among the main encoding tables and the first and second substitution encoding tables which is used next to generate an output code word immediately following the output code word accompanied with the state information in a manner such that a resultant succession of the output code words follows prescribed run length limiting rules, and wherein NRZI conversion results of output code words in first specified one of the main encoding tables which are assigned to prescribed input data words are opposite in polarity to NRZI conversion results of output code words in second specified one of the main encoding tables which are assigned to the prescribed input data words;

wherein the first substitution encoding tables contain output code words assigned to input data words, and contain state information accompanying each output code word, wherein the state information designates an encoding table among the main encoding tables and the first and second substitution encoding tables which is used next to generate an output code word immediately following "r" connection bits connected to the output code word accompanied with the state information in a manner such that a resultant succession of the output code words with the connection bits follows the prescribed run length limiting rules, and wherein "r" denotes a third predetermined natural number;

wherein the second substitution encoding tables contain output code words assigned to input data words, and contain state information accompanying each output code word, wherein the state information designates an encoding table among the main encoding tables and the first and second substitution encoding tables which is used next to generate an output code word immediately following "r" connection bits connected to the output code word accompanied with the state information in a manner such that a resultant succession of the output code words with the connection bits follows the prescribed run length limiting rules;

wherein NRZI conversion results of output code words in the first substitution encoding tables which are assigned to input data words are opposite in polarity to NRZI conversion results of output code words in the second substitution encoding tables which are assigned to said input data words, and wherein the first substitution encoding tables are equal to the second substitution encoding tables in assignment of state information to input data words;

means for periodically selecting the main encoding tables instead of the first and second substitution encoding tables, and using the selected main encoding tables in modulating "p"-bit input data words into "q"-bit output code words;

means for periodically selecting the first and second substitution encoding tables instead of the main encoding tables, and using the selected first and second substitution encoding tables in modulating "p"-bit input data words into "q"-bit output code words;

means for generating a final "q"-bit output code word in response to a current input data word different from the prescribed input data words by referring to one of the main encoding tables when the main encoding tables are selected;

means for generating a first candidate output code word in response to a current input data word equal to one of the prescribed input data words by referring to the first specified one of the main encoding tables when the main encoding tables are selected;

means for generating a second candidate output code word in response to the current input data word equal to said one of the prescribed input data words by referring to the second specified one of the main encoding tables when the main encoding tables are selected;

means for calculating a first DSV from a succession of output code words including the first candidate output code word;

means for calculating a second DSV from a succession of output code words including the second candidate output code word;

means for determining which of an absolute value of the first DSV and an absolute value of the second DSV is smaller;

means for selecting one from the first and second candidate output code words which corresponds to the smaller DSV absolute value as a final "q"-bit output code word;

means for generating a third candidate output code word in response to a current input data word by referring to one of the first substitution encoding tables when the first and second substitution encoding tables are selected;

means for adding "r" connection bits to the third candidate output code word to get a fourth candidate output code word;

means for generating a fifth candidate output code word in response to the current input data word by referring to one of the second substitution encoding tables when the first and second substitution encoding tables are selected;

means for adding "r" connection bits to the fifth candidate output code word to get a sixth candidate output code word;

means for calculating a third DSV from a succession of output code words including the fourth candidate output code word;

means for calculating a fourth DSV from a succession of output code words including the sixth candidate output code word;

means for determining which of an absolute value of the third DSV and an absolute value of the fourth DSV is smaller;

means for selecting one from the fourth and sixth candidate output code words which corresponds to the smaller DSV absolute value as a final "q+r"-bit output code word; and means for connecting final "r"-bit output code words and final "q+r"-bit output code words into an output-code-word sequence which follows the prescribed run length limiting rules.

5. A modulation apparatus as recited in claim 4, wherein the numbers "p", "q", and "r" are equal to 8, 15, and 2 respectively, and wherein the prescribed run length limiting rules causes a minimum run length in a result of NRZI conversion of the output-code-word sequence to be equal to 3T, and causes a maximum run length therein to be equal to 14T or less, where T denotes a channel bit period related to the final "r"-bit output code words and the final "q+r"-bit output code words.

6. An apparatus for demodulating a code-word sequence, which is generated by the apparatus of claim 4, into a data-word sequence, the demodulating apparatus comprising:

means for detecting whether a current input code word results from modulation using one of the main encoding tables or modulation using one of the first and second substitution encoding tables;

means for, when it is detected that the current input code word results from modulation using one of the main encoding tables, generating first encoding-state information from the current input code word and a next input code word, the first encoding-state information representing which of the main encoding tables has been used in generating the next input code word;

means for demodulating the current input code word into an original data word by referring to a main decoding table in response to the current input code word and the first encoding-state information;

means for, when it is detected that the current input code word results from modulation using one of the first and second substitution encoding tables, selecting one from first and second substitution decoding tables in response to the current input code word;

means for, when it is detected that the current input code word results from modulation using one of the first and second substitution encoding tables, deleting connection bits from the current input code word to get a normal-length current input code word;

means for generating second encoding-state information from the normal-length current input code word and a next input code word, the second encoding-state information representing which of the first and second substitution encoding tables has been used in generating the next input code word; and means for demodulating the normal-length current input code word into an original data word by referring to the selected substitution decoding table in response to the normal-length current input code word and the second encoding-state information.

7. A recording medium storing a signal resulting from NRZI conversion of a code-word sequence which is generated by a procedure including the steps of:

modulating "p"-bit input data words into "q"-bit output code words by referring to a set of main encoding tables, a set of first substitution encoding tables, and a set of second substitution encoding tables, wherein "p" denotes a first predetermined natural number and "q" denotes a second predetermined natural number greater than the number "p";

wherein the main encoding tables contain output code words assigned to input data words, and contain state information accompanying each output code word, wherein the state information designates an encoding table among the main encoding tables and the first and second substitution encoding tables which is used next to generate an output code word immediately following the output code word accompanied with the state information in a manner such that a resultant succession of the output code words follows prescribed run length limiting rules, and wherein NRZI conversion results of output code words in first specified one of the main encoding tables which are assigned to prescribed input data words are opposite in polarity to NRZI conversion results of output code words in second specified one of the main encoding tables which are assigned to the prescribed input data words;

wherein the first substitution encoding tables contain output code words assigned to input data words, and contain state information accompanying each output code word, wherein the state information designates an encoding table among the main encoding tables and the first and second substitution encoding tables which is used next to generate an output code word immediately following "r" connection bits connected to the output code word accompanied with the state information in a manner such that a resultant succession of the output code words with the connection bits follows the prescribed run length limiting rules, and wherein "r" denotes a third predetermined natural number;

wherein the second substitution encoding tables contain output code words assigned to input data words, and contain state information accompanying each output code word, wherein the state information designates an encoding table among the main encoding tables and the first and second substitution encoding tables which is used next to generate an output code word immediately following "r" connection bits connected to the output code word accompanied with the state information in a manner such that a resultant succession of the output code words with the connection bits follows the prescribed run length limiting rules;

wherein NRZI conversion results of output code words in the first substitution encoding tables which are assigned to input data words are opposite in polarity to NRZI conversion results of output code words in the second substitution encoding tables which are assigned to said input data words, and wherein the first substitution encoding tables are equal to the second substitution encoding tables in assignment of state information to input data words;

periodically selecting the main encoding tables instead of the first and second substitution encoding tables, and using the selected main encoding tables in modulating "p"-bit input data words into "q"-bit output code words;

periodically selecting the first and second substitution encoding tables instead of the main encoding tables, and using the selected first and second substitution encoding tables in modulating "p"-bit input data words into "q"-bit output code words;

generating a final "q"-bit output code word in response to a current input data word different from the prescribed input data words by referring to one of the main encoding tables when the main encoding tables are selected;

generating a first candidate output code word in response to a current input data word equal to one of the prescribed input data words by referring to the first specified one of the main encoding tables when the main encoding tables are selected;

generating a second candidate output code word in response to the current input data word equal to said one of the prescribed input data words by referring to the second specified one of the main encoding tables when the main encoding tables are selected;

calculating a first DSV from a succession of output code words including the first candidate output code word;

calculating a second DSV from a succession of output code words including the second candidate output code word;

determining which of an absolute value of the first DSV and an absolute value of the second DSV is smaller;

selecting one from the first and second candidate output code words which corresponds to the smaller DSV absolute value as a final "q"-bit output code word;

generating a third candidate output code word in response to a current input data word by referring to one of the first substitution encoding tables when the first and second substitution encoding tables are selected;

adding "r" connection bits to the third candidate output code word to get a fourth candidate output code word;

generating a fifth candidate output code word in response to the current input data word by referring to one of the second substitution encoding tables when the first and second substitution encoding tables are selected;

adding "r" connection bits to the fifth candidate output code word to get a sixth candidate output code word;

calculating a third DSV from a succession of output code words including the fourth candidate output code word;

calculating a fourth DSV from a succession of output code words including the sixth candidate output code word;

determining which of an absolute value of the third DSV and an absolute value of the fourth DSV is smaller;

selecting one from the fourth and sixth candidate output code words which corresponds to the smaller DSV absolute value as a final "q+r"-bit output code word; and connecting final "r"-bit output code words and final "q+r"-bit output code words into an output-code-word sequence which follows the prescribed run length limiting rules;

wherein the numbers "p", "q", and "r" are equal to 8, 15, and 2 respectively, and wherein the prescribed run length limiting rules causes a minimum run length in a result of NRZI conversion of the output-code-word sequence to be equal to 3T, and causes a maximum run length therein to be equal to 14T or less, where T denotes a channel bit period related to the final "r"-bit output code words and the final "q+r"-bit output code words.

8. A modulation apparatus comprising:

main encoding tables for conversion from "p"-bit input data words into "q"-bit output code words accompanied with next-table selection numbers respectively, the main encoding tables having different ID numbers respectively, wherein "p" denotes a first predetermined natural number and "q" denotes a second predetermined natural number greater than the number "p";

first substitution encoding tables for conversion from "p"-bit input data words into "q"-bit output code words accompanied with next-table selection numbers respectively, the first substitution encoding tables having different ID numbers respectively;

second substitution encoding tables for conversion from "p"-bit input data words into "q"-bit output code words accompanied with next-table selection numbers respectively, the second substitution encoding tables having different ID numbers respectively;

means for generating a first candidate output code word in response to a first input data word by referring to one of the first substitution encoding tables which has an ID number equal to a next-table selection number accompanying an output code word for an input data word immediately preceding the first input data word;

means for adding "r" connection bits to the first candidate output code word to get a second candidate output code word without referring to the first substitution encoding tables, wherein "r" denotes a third predetermined natural number;

means for generating a third candidate output code word in response to the first input data word by referring to one of the second substitution encoding tables which has an ID number equal to the next-table selection number accompanying the output code word for the input data word immediately preceding the first input data word;

means for adding "r" connection bits to the third candidate output code word to get a fourth candidate output code word without referring to the second substitution encoding tables;

means for generating a final "q"-bit output code word in response to a second input data word by referring to one of the main encoding tables which has an ID number equal to a next-table selection number accompanying one of the first and third candidate output code words;

means for generating a first succession of output code words including the second candidate output code word and the final "q"-bit output code word;

means for generating a second succession of output code words including the fourth candidate output code word and the final "q"-bit output code word;

means for calculating a first DSV from the first succession of output code words;

means for calculating a second DSV from the second succession of output code words;

means for comparing the first DSV and the second DSV with each other to get a DSV comparison result;

means for selecting one from the second and fourth candidate output code words in response to the DSV comparison result as a final "q+r"-bit output code word; and means for connecting the final "r"-bit output code word and the final "q+r"-bit output code word into a portion of an output-code-word sequence which follows prescribed run length limiting rules.

* * * * *